(12) United States Patent
Akutsu

(10) Patent No.: US 12,165,957 B2
(45) Date of Patent: Dec. 10, 2024

(54) SEMICONDUCTOR DEVICE

(71) Applicant: ROHM CO., LTD., Kyoto (JP)

(72) Inventor: Minoru Akutsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 456 days.

(21) Appl. No.: 17/596,926

(22) PCT Filed: Jun. 19, 2020

(86) PCT No.: PCT/JP2020/024238
§ 371 (c)(1),
(2) Date: Dec. 21, 2021

(87) PCT Pub. No.: WO2021/002225
PCT Pub. Date: Jan. 7, 2021

(65) Prior Publication Data
US 2022/0319964 A1    Oct. 6, 2022

(30) Foreign Application Priority Data

Jul. 1, 2019    (JP) ................. 2019-122873

(51) Int. Cl.
| | |
|---|---|
| *H01L 23/495* | (2006.01) |
| *H01L 23/29* | (2006.01) |
| *H01L 23/31* | (2006.01) |
| *H01L 29/20* | (2006.01) |
| *H01L 29/417* | (2006.01) |
| *H01L 29/778* | (2006.01) |

(52) U.S. Cl.
CPC ...... *H01L 23/49562* (2013.01); *H01L 23/293* (2013.01); *H01L 23/3107* (2013.01); *H01L 29/4175* (2013.01); *H01L 29/2003* (2013.01); *H01L 29/7786* (2013.01)

(58) Field of Classification Search
CPC .............. H01L 23/49562; H01L 29/4175
See application file for complete search history.

(56) References Cited

FOREIGN PATENT DOCUMENTS

| JO | 2005-175512 A | 6/2005 |
|---|---|---|
| JP | 5-121615 A | 5/1993 |

(Continued)

OTHER PUBLICATIONS

Office Action received in corresponding Japanese Patent Application No. 2021-529962, Apr. 30, 2024, and machine translation (8 pages).

(Continued)

*Primary Examiner* — David A Zarneke
(74) *Attorney, Agent, or Firm* — HSML P.C.

(57) ABSTRACT

A semiconductor device includes a semiconductor element, a first lead, a second lead and a connection lead. The semiconductor element includes an electron transit layer formed of a nitride semiconductor, an element obverse face and an element reverse face that are arranged to face opposite to each other in a thickness direction, and a gate electrode, a source electrode and a drain electrode that are disposed on the element obverse face. The drain electrode is bonded to the first lead. The source electrode is bonded to the second lead. The connection lead is connected to the second lead and disposed on the element reverse face so as to overlap with the semiconductor element as viewed in the thickness direction. The connection lead provides a conduction path for a principal current subjected to switching.

18 Claims, 18 Drawing Sheets

(56) References Cited

FOREIGN PATENT DOCUMENTS

| | | |
|---|---|---|
| JP | 7-201914 A | 8/1995 |
| JP | 2013-222781 A | 10/2013 |
| JP | 2015-8431 A | 1/2015 |
| JP | 2015-216346 A | 12/2015 |
| JP | 2018-56538 A | 4/2018 |
| JP | 2018-82011 A | 5/2018 |
| JP | 2018-113429 A | 7/2018 |

OTHER PUBLICATIONS

International Search Report issued in PCT/JP2020/024238, Sep. 8, 2020 (2 pages).

SEMICONDUCTOR DEVICE

TECHNICAL FIELD

The present disclosure relates to a semiconductor device.

BACKGROUND ART

A semiconductor element has been developed in a form of a high electron mobility transistor (HEMT), incorporated with a III-V compound nitride semiconductor (which may be referred to as "nitride semiconductor" below) such as gallium nitride (GaN). Patent Document 1 discloses a semiconductor device with a HEMT is packaged.

The above-mentioned semiconductor device is incorporated with the semiconductor element, and includes a source lead electrically connected to a source electrode, a drain lead electrically connected to a drain electrode, a gate lead electrically connected to a gate electrode, and a sealing resin covering the semiconductor element and the leads. A part of each of the leads is exposed from the encapsulating resin, to serve as a terminal for mounting the semiconductor device on a circuit board. In the semiconductor device, a principal current, the object of switching, is inputted through the drain lead and flows to the drain electrode, flows through the HEMT from the drain electrode to the source electrode, and outputted from the source electrode through the source lead. In proportion to the length of such current path, the inductance increases. The inductance may affect the switching performance of the semiconductor device.

PRIOR ART DOCUMENT

Patent Document

Patent Document 1: JP-A-2015-8431

SUMMARY OF INVENTION

Problem to be Solved by the Invention

In view of the foregoing situation, the present disclosure provides a semiconductor device configured to reduce the inductance.

Means to Solve the Problem

In an aspect, the present disclosure provides a semiconductor device comprising: a semiconductor element including an electron transit layer formed of a nitride semiconductor, an element obverse face and an element reverse face that are arranged to face opposite to each other in a thickness direction, and a gate electrode, a source electrode and a drain electrode that are disposed on the element obverse face; a first lead to which the drain electrode is bonded; a second lead to which the source electrode is bonded; and a connection lead connected to the second lead and disposed on the element reverse face so as to overlap with the semiconductor element as viewed in the thickness direction. The connection lead provides a conduction path for a principal current subjected to switching.

Advantages of the Invention

In the semiconductor device according to the present disclosure, the principal current is inputted through the first lead and flows to the drain electrode, flows through the semiconductor element from the drain electrode to the source electrode, flows from the source electrode to the second lead, and flows from the second lead to the connection lead. Since the drain electrode is bonded to the first lead, and the source electrode is bonded to the second lead, the inductance can be reduced, compared with the case where bonding wires are employed for the connection. Further, since the connection lead is disposed on the element reverse face so as to overlap with the semiconductor element, the principal current flows in a direction opposite to the current path from the first lead to the second lead. A magnetic field generated by the principal current flowing through the current path from the first lead to the second lead and another magnetic field generated by the principal current flowing through the connection lead will cancel each other, which is advantageous to reducing the generation of the inductance.

Other features and advantages of the present disclosure will become more apparent, through detailed description given hereunder with reference to the accompanying drawings.

MODE FOR CARRYING OUT THE INVENTION

Hereafter, preferred embodiments of the present disclosure will be described with reference to the accompanying drawings.

Referring to FIG. 1 to FIG. 9, a semiconductor device A1 according to a first embodiment of the present disclosure will be described. The semiconductor device A1 includes a plurality of leads 1 to 5, a connection lead 6, a semiconductor element 7, and a sealing resin 8.

Figure 1:
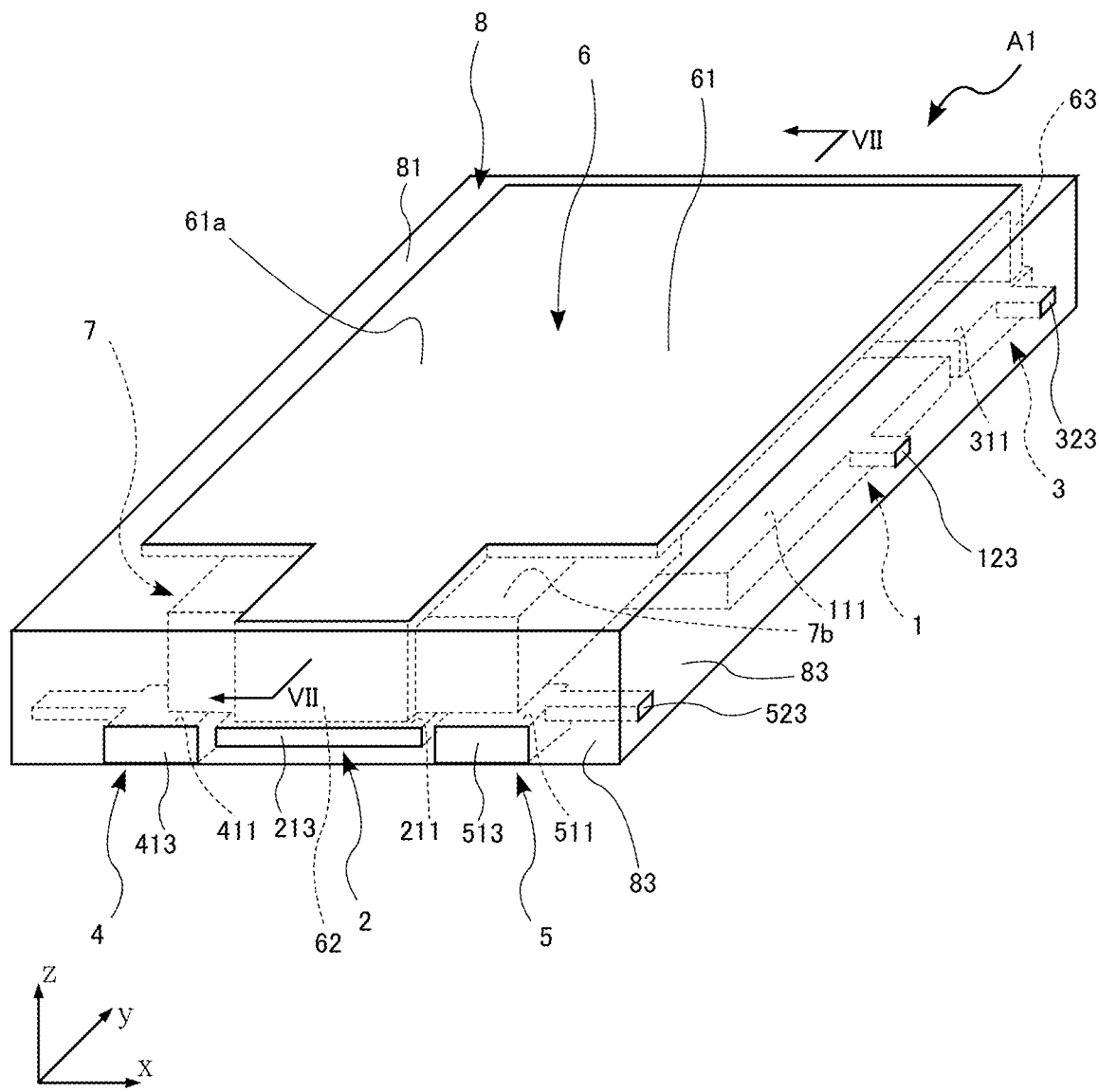
FIG. 1 is a perspective view showing a semiconductor device according to a first embodiment.
Figure 2:
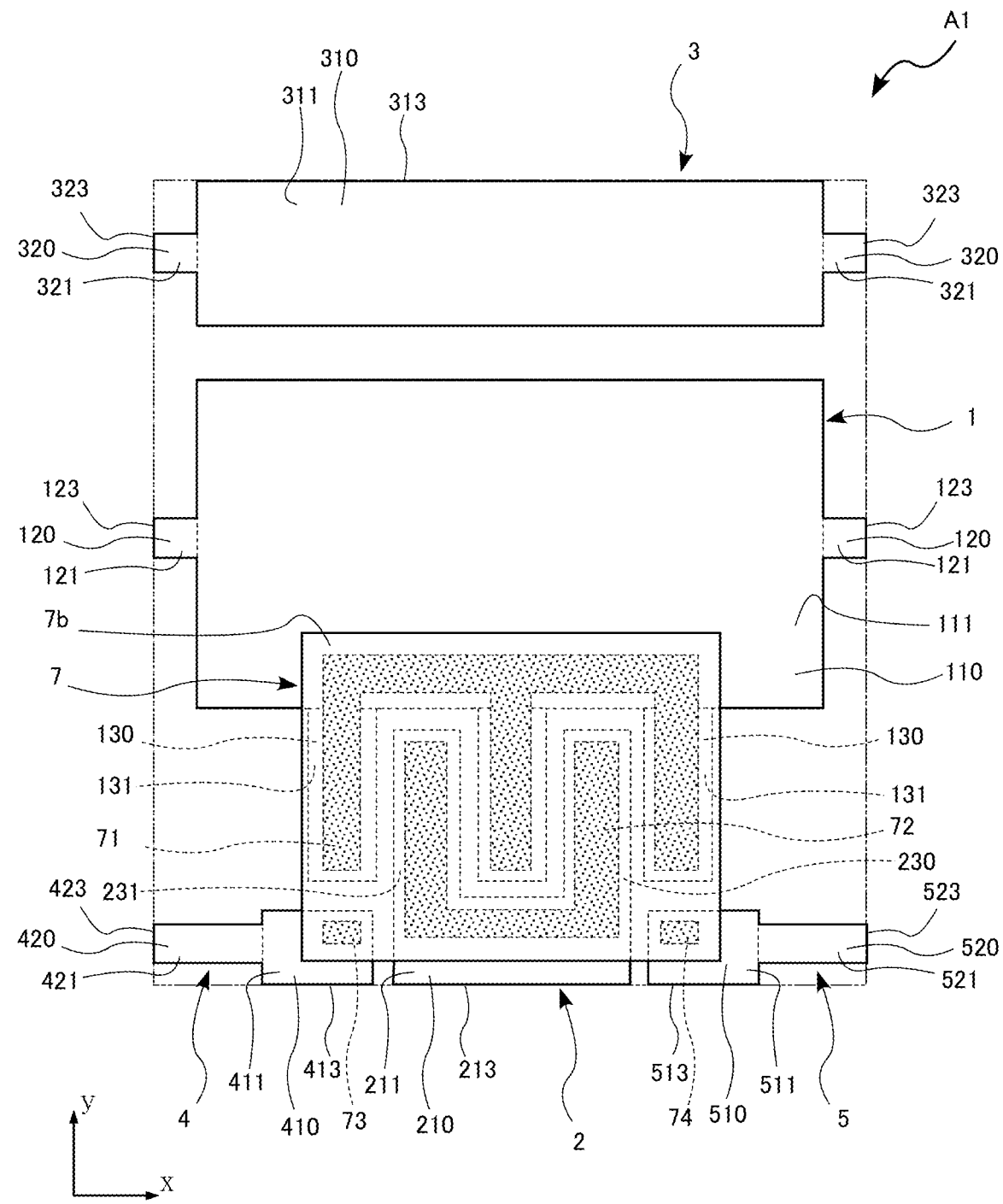
FIG. 2 is a plan view of the semiconductor device shown in FIG. 1.
Figure 3:
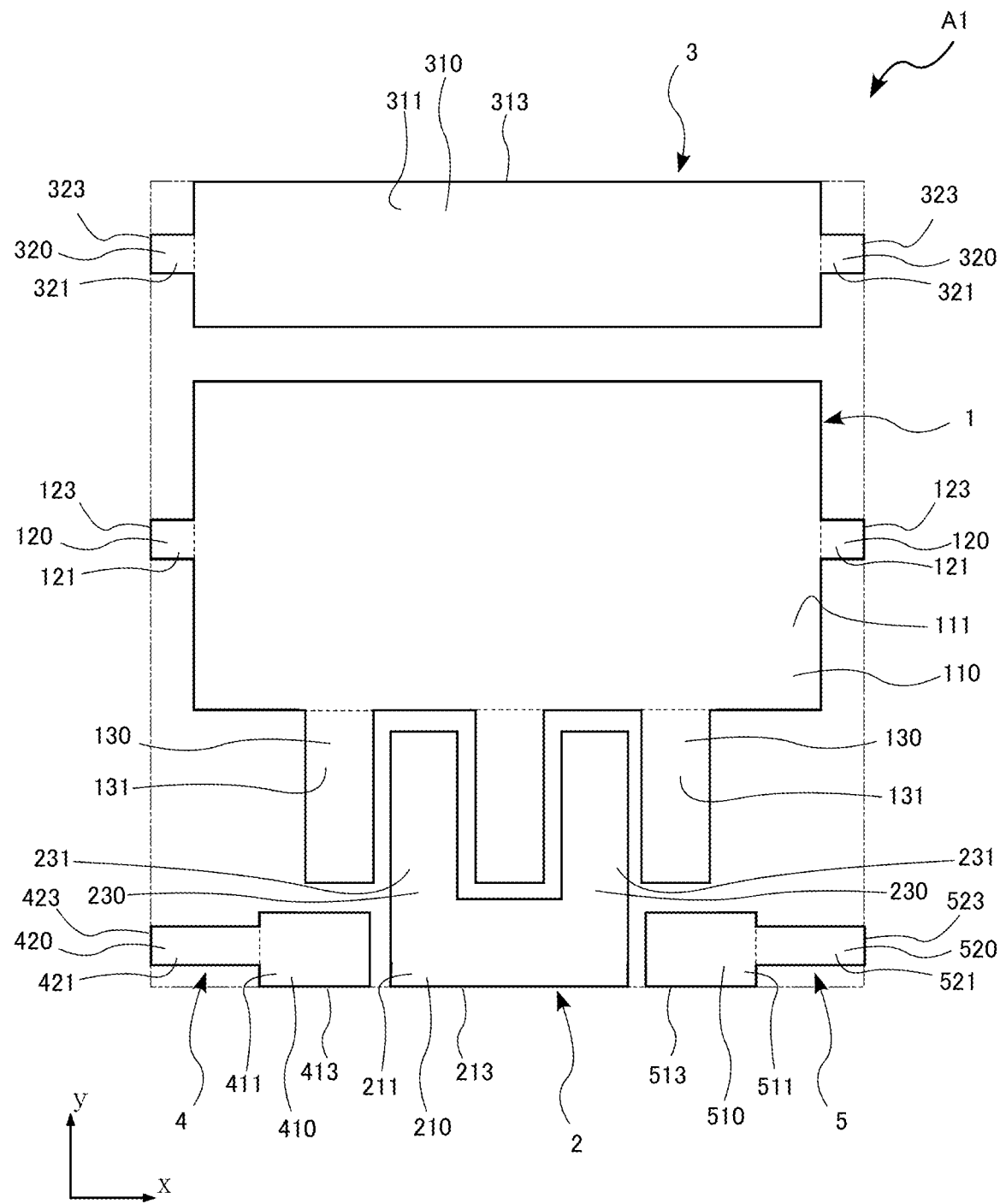
FIG. 3 is another plan view of the semiconductor device shown in FIG. 1.
Figure 4:
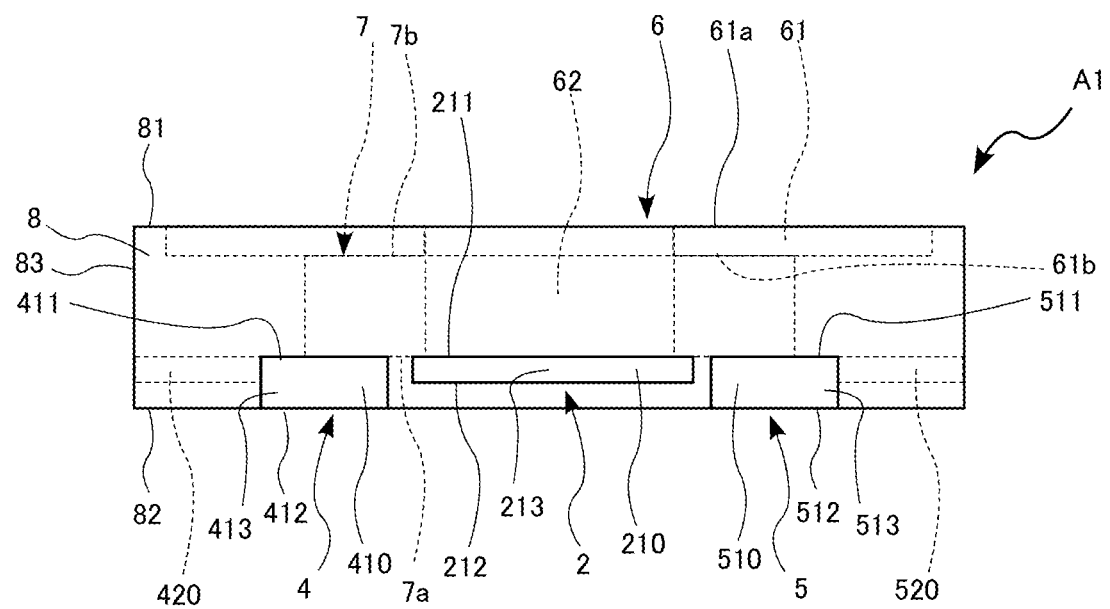
FIG. 4 is a front view of the semiconductor device shown in FIG. 1.
Figure 4:
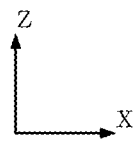
Figure 5:
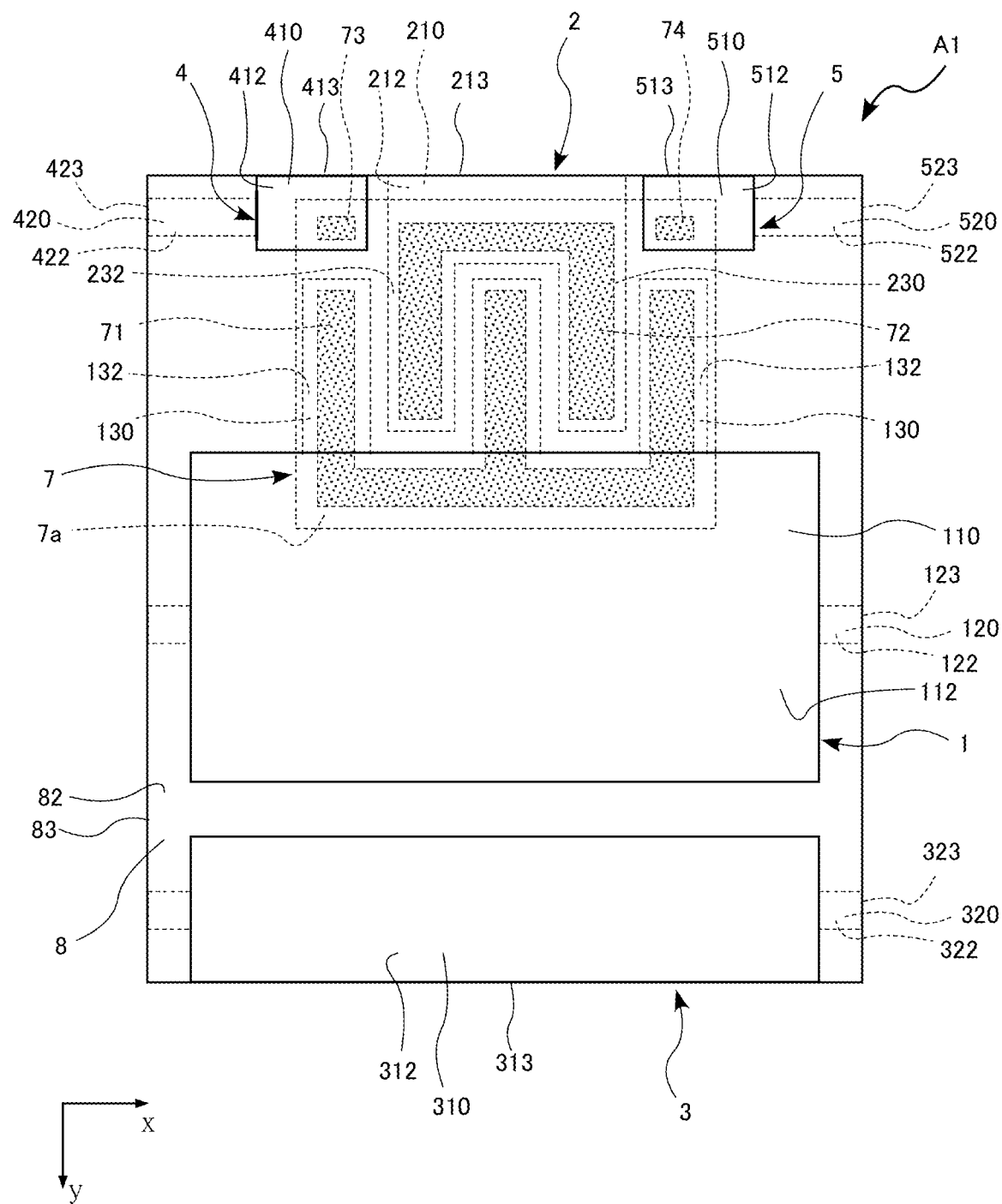
FIG. 5 is a bottom view of the semiconductor device shown in FIG. 1.
Figure 6:
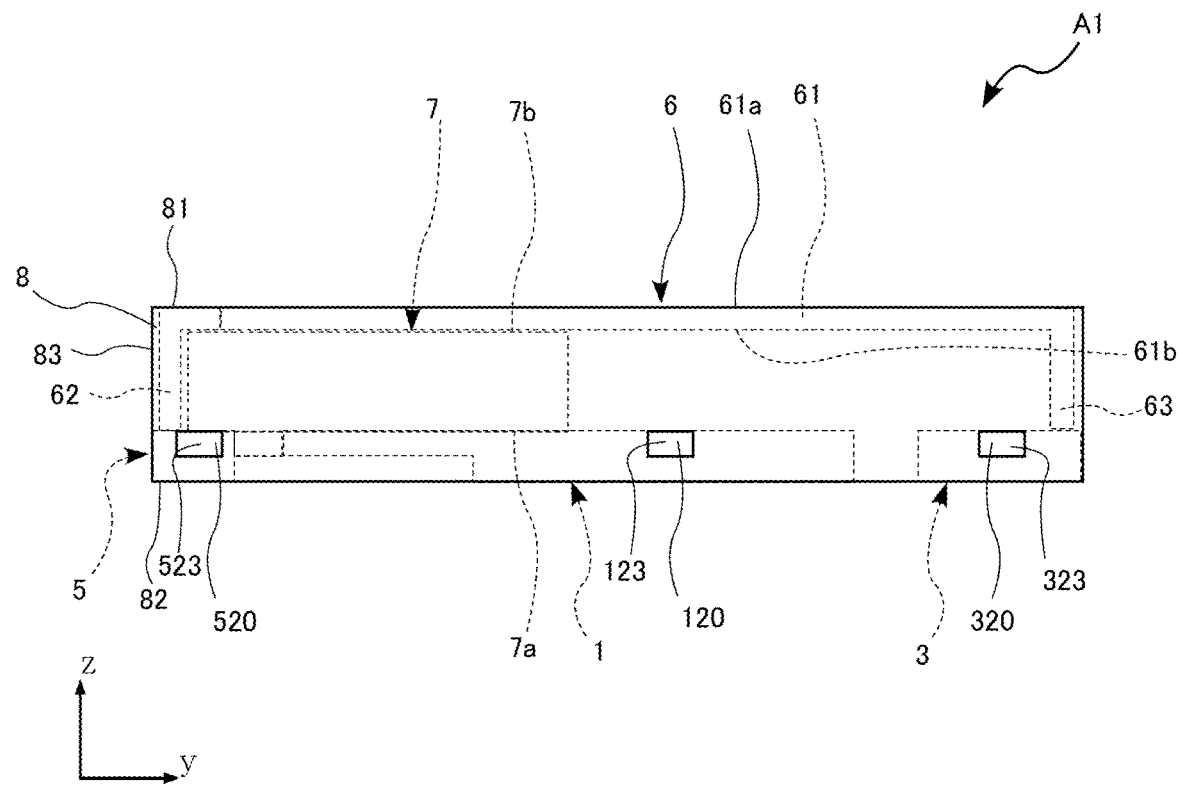
FIG. 6 is a right side view of the semiconductor device shown in FIG. 1.
Figure 7:
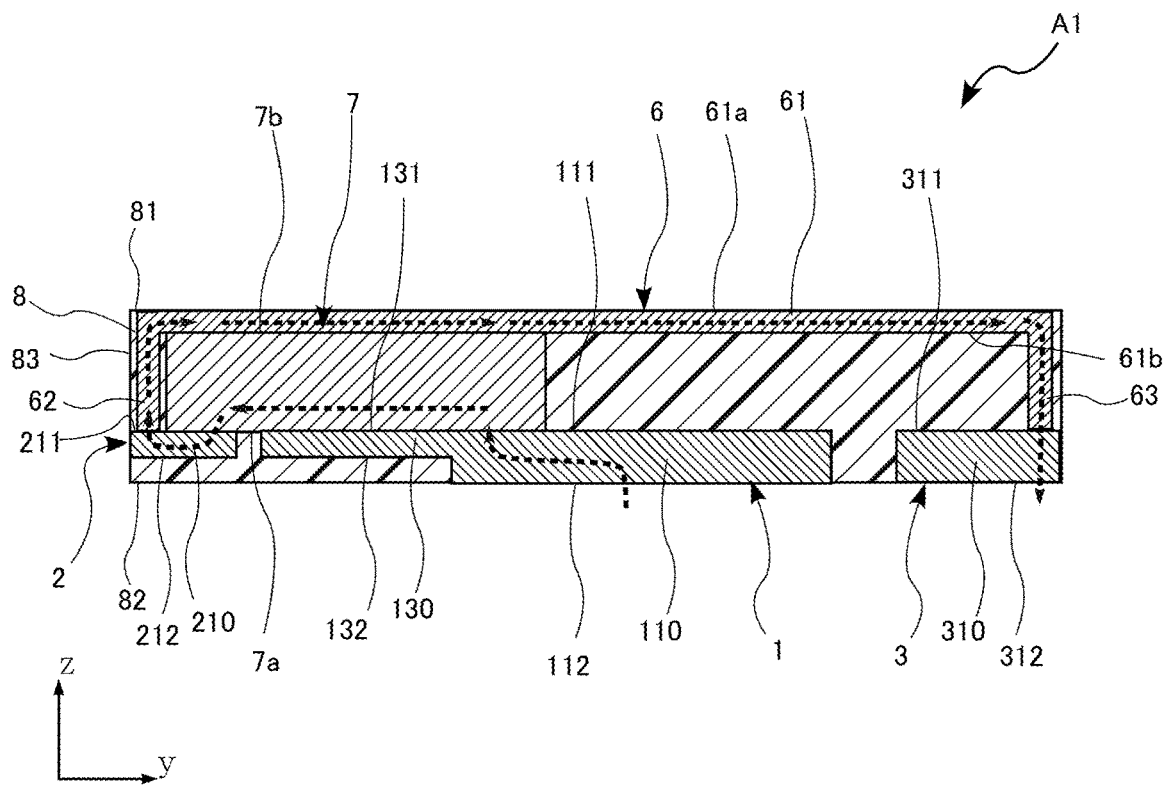
FIG. 7 is a cross-sectional view taken along a line VII-VII in FIG. 1.
Figure 8:
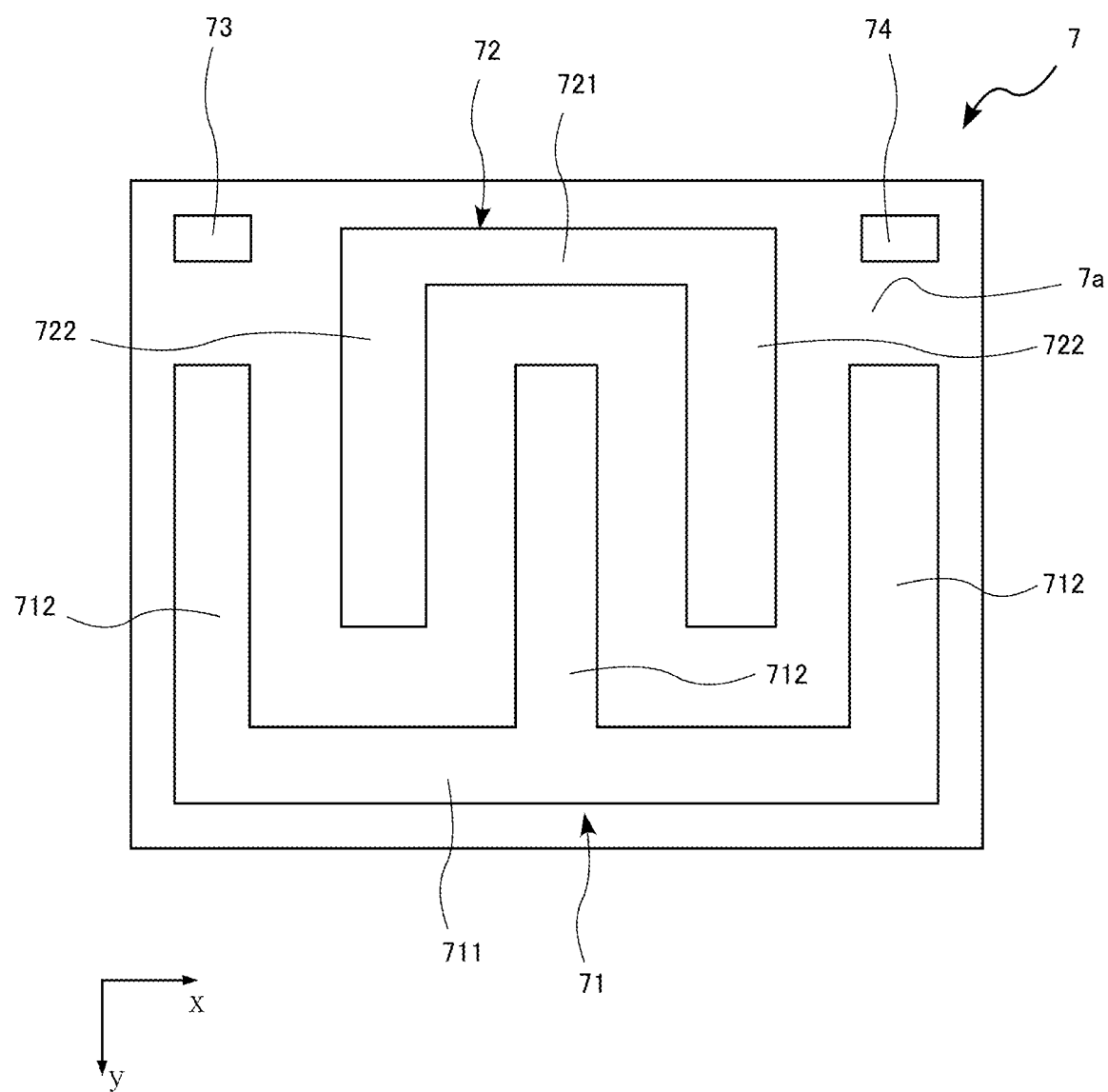
FIG. 8 is a plan view showing a semiconductor element.
Figure 9:
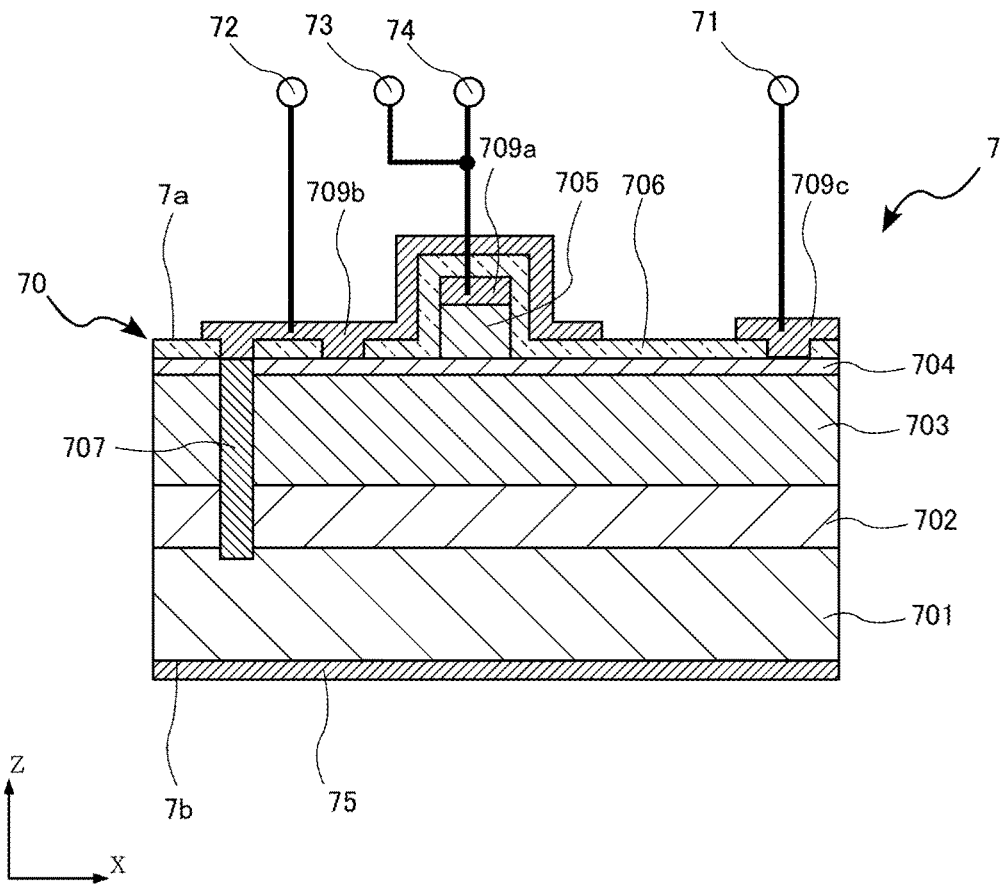
FIG. 9 is a schematic cross-sectional view showing the semiconductor element.

FIG. 1 is a perspective view showing the semiconductor device A1. FIG. 2 and FIG. 3 are plan views each showing the semiconductor device A1. For the sake of clarity, FIG. 2 illustrates a view seen through the sealing resin 8 and the connection lead 6, indicating the outline of the sealing resin 8 by imaginary lines (dash-dot-dot lines). In FIG. 3, the semiconductor element 7 is also seen through. FIG. 4 is a front view of the semiconductor device A1. FIG. 5 is a bottom view of the semiconductor device A1. FIG. 6 is a right side view of the semiconductor device A1. FIG. 7 is a cross-sectional view taken along a line VII-VII in FIG. 1. FIG. 8 is a plan view showing the semiconductor element 7. FIG. 9 is a schematic cross-sectional view showing the semiconductor element 7.

The semiconductor device A1 shown in the drawings is to be surface-mounted on a circuit board of various types of apparatuses. The semiconductor device A1 has a rectangular shape, as viewed in a thickness direction. For the sake of convenience in description, the thickness direction of the semiconductor device A1 will be defined as z-direction, a direction along one side of the semiconductor device A1, orthogonal to the z-direction (left-right direction in FIG. 2) will be defined as x-direction, and a direction orthogonal to the z-direction and the x-direction (up-down direction in FIG. 2) will be defined as y-direction. The z-direction corresponds to the "thickness direction" in the present disclosure. The size of the semiconductor device A1 is not specifically limited but, for example, the size in the x-direction is approximately 1 to 10 mm, the size in the y-direction is approximately 1 to 20 mm, and the size in the z-direction is approximately 0.3 to 3 mm, in this embodiment.

The plurality of leads 1 to 5 may serve to support the semiconductor element 7 and may be electrically connected to the semiconductor element 7. The leads 1 to 5 are formed of a metal, preferably one of Cu and Ni, an alloy thereof, or a 42-alloy. In this embodiment, it will be assumed that the leads 1 to 5 are formed of Cu. The thickness of the leads 1 to 5 may be, for example, 0.08 to 1 mm, and is approximately 0.5 mm in this embodiment. The leads 1 to 5 may be formed, for example, by subjecting a metal plate to an etching process. The leads 1 to 5 may also be formed by punching or bending a metal plate. To individually describe each of the leads 1 to 5 in the subsequent description, the leads 1 to 5 will be referred to as a first lead 1, a second lead 2, a third lead 3, a fourth lead 4, and a fifth lead 5. Otherwise, the leads will be collectively referred to as leads 1 to 5.

As shown in FIG. 3, the first lead 1 is disposed at a generally central position on the semiconductor device A1 in the y-direction, and extends all the way in the x-direction. The second lead 2 and the third lead 3 are disposed on opposite sides across the first lead 1 in the y-direction, with a spacing from the first lead 1. The second lead 2 is disposed at the end portion on one side in the y-direction (lower end in FIG. 3), and at a generally central position in the x-direction. The third lead 3 is disposed at the end portion on the other side in the y-direction (upper end in FIG. 3), and extends all the way in the x-direction. The fourth lead 4 and the fifth lead 5 are disposed on the same side as the second lead 2 in the y-direction, with respect to the first lead 1 (lower side in FIG. 3), with a spacing therefrom. In other words, as viewed in the z-direction, the third lead 3, and the second lead 2, the fourth lead 4, and the fifth lead 5 are disposed on the opposite sides to each other, across the first lead 1. In addition, the fourth lead 4 and the fifth lead 5 are disposed on the opposite sides to each other in the x-direction, across the second lead 2 with a spacing therefrom. The fourth lead 4 disposed at the end portion on one side in the y-direction, and at the end portion on one side in the x-direction (left end in FIG. 3). The fifth lead 5 is disposed at the end portion on one side in the y-direction, and at the end portion on the other side in the x-direction (right end in FIG. 3). The first lead 1 is larger in size in the z-direction, than the other leads 2 to 5. The second lead 2 is smaller in size in the z-direction than the third lead 3, the fourth lead 4 and the fifth lead 5 being approximately the same, and smallest.

The first lead 1 includes a terminal section 110, a connecting section 120, and an extended section 130.

The terminal section 110 has a rectangular shape elongate in the x-direction, as viewed in the z-direction. The terminal section 110 includes a terminal section obverse face 111 and a terminal section reverse face 112. The terminal section obverse face 111 and the terminal section reverse face 112 are arranged to face opposite to each other, in the z-direction. The terminal section obverse face 111 is arranged to face upward, in FIG. 4, FIG. 6, and FIG. 7. To the terminal section obverse face 111, a part of the semiconductor element 7 is bonded. The terminal section reverse face 112 is arranged to face downward, in FIG. 4, FIG. 6, and FIG. 7. The terminal section reverse face 112 is exposed from the sealing resin 8, thus constituting a reverse face terminal. Here, the terminal section 110 may include a reverse face recess, where a part of the terminal section 110 is recessed from the terminal section reverse face 112 in the z-direction, for example formed by a half etching process.

The connecting section 120 is connected to the terminal section 110, and has a rectangular shape as viewed in the z-direction. The connecting section 120 is disposed on one of the end faces of the terminal section 110 in the x-direction. In addition, another connecting section 120 is disposed on the other end face of the terminal section 110 in the x-direction. In other words, two connecting sections 120 are provided, in total. The connecting sections 120 each include a connecting section obverse face 121, a connecting section reverse face 122, and a connecting section end face 123. The connecting section obverse face 121 and the connecting section reverse face 122 are arranged to face opposite to each other, in the z-direction. The connecting section obverse face 121 is arranged to face upward, in FIG. 4, FIG. 6, and FIG. 7. The connecting section obverse face 121 and the terminal section obverse face 111 are flush with each other. The connecting section reverse face 122 is arranged to face downward, in FIG. 4, FIG. 6, and FIG. 7. The thickness of the connecting section 120 (size in the z-direction) is approximately half a thickness of the terminal section 110. The connecting section 120 is, for example, formed through a half etching process. The connecting section end face 123 is connected to the connecting section obverse face 121 and the connecting section reverse face 122, and oriented or facing to the outer side in the x-direction. The connecting section end face 123 is exposed from the sealing resin 8 (see FIG. 1 and FIG. 6).

The extended section 130 is connected to the terminal section 110, and has a rectangular shape elongate in the y-direction, as viewed in the z-direction. The extended section 130 extends in the y-direction, from the end face of the terminal section 110 on one side in the y-direction (lower end face in FIG. 3). In other words, the extended section 130 extends from the terminal section 110 toward the second lead 2. In this embodiment, three extended sections 130 are aligned in the x-direction, at regular intervals. In other words, the first lead 1 is formed in a comb teeth shape as a whole, as viewed in the z-direction. The extended sections 130 each include an extended section obverse face 131 and an extended section reverse face 132. The extended section obverse face 131 and the extended section reverse face 132 are arranged to face opposite to each other, in the z-direction. The extended section obverse face 131 is arranged to face upward, in FIG. 4, FIG. 6, and FIG. 7. To the extended section obverse face 131, a part of the semiconductor element 7 is bonded. The extended section obverse face 131 and the terminal section obverse face 111 are flush with each other. Accordingly, the terminal section obverse face 111, the connecting section obverse face 121, and the extended section obverse face 131 constitute a unified flat surface (see FIG. 3). The extended section reverse face 132 is arranged to face downward, in FIG. 4, FIG. 6, and FIG. 7. The thickness of the extended section 130 (size in the z-direction) is approximately half a thickness of the terminal section 110. The extended section 130 is, for example, formed through a half etching process. The extended section 130 is entirely covered with the sealing resin 8, without being exposed therefrom. The extended section 130 corresponds to the "first extended section" in the present disclosure.

The second lead 2 includes a supporting section 210 and an extended section 230.

The supporting section 210 has a rectangular shape elongate in the x-direction, as viewed in the z-direction. The supporting section 210 includes a supporting section obverse face 211, a supporting section reverse face 212, and a supporting section end face 213. The supporting section obverse face 211 and the supporting section reverse face 212 are arranged to face opposite to each other, in the z-direction. The supporting section obverse face 211 is arranged to face upward, in FIG. 4, FIG. 6, and FIG. 7. To the supporting section obverse face 211, a part of the semiconductor element 7 is bonded. The supporting section reverse face 212 is arranged to face downward, in FIG. 4, FIG. 6, and FIG. 7. The thickness of the supporting section 210 (size in the z-direction) is approximately half a thickness of the terminal section 110 of the first lead 1. The supporting section 210 is, for example, formed through a half etching process. The supporting section obverse face 211 and the supporting section reverse face 212 are not exposed from the sealing resin 8. The supporting section end face 213 is connected to the supporting section obverse face 211 and the supporting section reverse face 212, and oriented to the outer side in the y-direction (lower side in FIG. 3). The supporting section end face 213 is exposed from the sealing resin 8 (see FIG. 1 and FIG. 4).

The extended section 230 is connected to the supporting section 210, and has a rectangular shape elongate in the y-direction, as viewed in the z-direction. The extended section 230 extends in the y-direction, from the other end face of the supporting section 210 in the y-direction (upper end face in FIG. 3). In other words, the extended section 230 extends from the supporting section 210 toward the first lead 1. In this embodiment, two extended sections 230 are aligned in the x-direction. In other words, the second lead 2 is formed in a comb teeth shape as a whole, as viewed in the z-direction. In addition, the extended sections 230 are each disposed between the extended sections 130 of the first lead 1. In other words, the extended sections 130 and the extended sections 230 are alternately disposed, in the x-direction. The extended sections 230 each include an extended section obverse face 231 and an extended section reverse face 232. The extended section obverse face 231 and the extended section reverse face 232 are arranged to face opposite to each other, in the z-direction. The extended section obverse face 231 is arranged to face upward, in FIG. 4, FIG. 6, and FIG. 7. To the extended section obverse face 231, a part of the semiconductor element 7 is bonded. The extended section obverse face 231 and the supporting section obverse face 211 are flush with each other. The extended section reverse face 232 is arranged to face downward, in FIG. 4, FIG. 6, and FIG. 7. The extended section reverse face 232 and the supporting section reverse face 212 are flush with each other. Accordingly, the thickness of the extended section 230 (size in the z-direction) is approximately the same as that of the supporting section 210. The extended section 230 is, for example, formed through a half etching process. The extended section 230 is entirely covered with the sealing resin 8, without being exposed therefrom. The extended section 230 corresponds to the "second extended section" in the present disclosure.

The third lead 3 includes a terminal section 310 and a connecting section 320.

The terminal section 310 has a rectangular shape elongate in the x-direction, as viewed in the z-direction. The terminal section 310 includes a terminal section obverse face 311, a terminal section reverse face 312, and a terminal section end face 313. The terminal section obverse face 311 and the terminal section reverse face 312 are arranged to face opposite to each other, in the z-direction. The terminal section obverse face 311 is arranged to face upward, in FIG. 4, FIG. 6, and FIG. 7. To the terminal section obverse face 311, a part of the semiconductor element 7 is bonded. The terminal section reverse face 312 is arranged to face downward, in FIG. 4, FIG. 6, and FIG. 7. The terminal section reverse face 312 is exposed from the sealing resin 8, thus constituting a reverse face terminal. The thickness of the terminal section 310 (size in the z-direction) is approximately the same as that of the terminal section 110 of the first lead 1. Here, the terminal section 310 may include a reverse face recess, where a part of the terminal section 310 is recessed from the terminal section reverse face 312 in the z-direction, for example formed by a half etching process. The terminal section end face 313 is connected to the terminal section obverse face 311 and the terminal section reverse face 312, and oriented to the outer side in the y-direction (upper side in FIG. 3), in other words to the opposite side of the first lead 1. The terminal section end face 313 is exposed from the sealing resin 8, thus constituting a terminal. The terminal section end face 313 corresponds to the "third end face" in the present disclosure.

The connecting section 320 is connected to the terminal section 310, and has a rectangular shape as viewed in the z-direction. The connecting section 320 is disposed on one of the end faces of the terminal section 310 in the x-direction. In addition, another connecting section 320 is disposed on the other end face of the terminal section 310 in the x-direction. In other words, two connecting sections 320 are provided, in total. The connecting sections 320 each include a connecting section obverse face 321, a connecting section reverse face 322, and a connecting section end face 323. The connecting section obverse face 321 and the connecting section reverse face 322 are arranged to face opposite to each other, in the z-direction. The connecting section obverse face 321 is arranged to face upward, in FIG. 4, FIG. 6, and FIG. 7. The connecting section obverse face 321 and the terminal section obverse face 311 are flush with each other. The connecting section reverse face 322 is arranged to face downward, in FIG. 4, FIG. 6, and FIG. 7. The thickness of the connecting section 320 (size in the z-direction) is approximately half a thickness of the terminal section 310. The connecting section 320 is, for example, formed through a half etching process. The connecting section end face 323 is connected to the connecting section obverse face 321 and the connecting section reverse face 322, and oriented to the outer side in the x-direction. The connecting section end face 323 is exposed from the sealing resin 8 (see FIG. 1 and FIG. 6).

The fourth lead 4 includes a terminal section 410 and a connecting section 420.

The terminal section 410 has a rectangular shape elongate in the x-direction, as viewed in the z-direction. The terminal section 410 includes a terminal section obverse face 411, a terminal section reverse face 412, and a terminal section end face 413. The terminal section obverse face 411 and the terminal section reverse face 412 are arranged to face opposite to each other, in the z-direction. The terminal section obverse face 411 is arranged to face upward, in FIG. 4, FIG. 6, and FIG. 7. To the terminal section obverse face 411, a part of the semiconductor element 7 is bonded. The terminal section reverse face 412 is arranged to face downward, in FIG. 4, FIG. 6, and FIG. 7. The terminal section reverse face 412 is exposed from the sealing resin 8, thus constituting a reverse face terminal. The thickness of the terminal section 410 (size in the z-direction) is approximately the same as that of the terminal section 110 of the first lead 1. Here, the terminal section 410 may include a reverse face recess, where a part of the terminal section 410 is recessed from the terminal section reverse face 412 in the z-direction, for example formed by a half etching process. The terminal section end face 413 is connected to the terminal section obverse face 411 and the terminal section reverse face 412, and oriented to the outer side in the y-direction (lower side in FIG. 3), in other words to the opposite side of the first lead 1. The terminal section end face 413 is exposed from the sealing resin 8, thus constituting a terminal. The terminal section end face 413 corresponds to the "fourth end face" in the present disclosure.

The connecting section 420 is connected to the terminal section 410, and has a rectangular shape elongate in the x-direction, as viewed in the z-direction. The connecting section 420 is disposed on one of the end faces of the terminal section 410 in the x-direction (left end face in FIG. 3). The connecting section 420 includes a connecting section obverse face 421, a connecting section reverse face 422, and a connecting section end face 423. The connecting section obverse face 421 and the connecting section reverse face 422 are arranged to face opposite to each other, in the z-direction. The connecting section obverse face 421 is arranged to face upward, in FIG. 4, FIG. 6, and FIG. 7. The connecting section obverse face 421 and the terminal section obverse face 411 are flush with each other. The connecting section reverse face 422 is arranged to face downward, in FIG. 4, FIG. 6, and FIG. 7. The thickness of the connecting section 420 (size in the z-direction) is approximately half a thickness of the terminal section 410. The connecting section 420 is, for example, formed through a half etching process. The connecting section end face 423 is connected to the connecting section obverse face 421 and the connecting section reverse face 422, and oriented to the outer side in the x-direction. The connecting section end face 423 is exposed from the sealing resin 8.

The fifth lead 5 includes a terminal section 510 and a connecting section 520.

The terminal section 510 has a rectangular shape elongate in the x-direction, as viewed in the z-direction. The terminal section 510 includes a terminal section obverse face 511, a terminal section reverse face 512, and a terminal section end face 513. The terminal section obverse face 511 and the terminal section reverse face 512 are arranged to face opposite to each other, in the z-direction. The terminal section obverse face 511 is arranged to face upward, in FIG. 4, FIG. 6, and FIG. 7. To the terminal section obverse face 511, a part of the semiconductor element 7 is bonded. The terminal section reverse face 512 is arranged to face downward, in FIG. 4, FIG. 6, and FIG. 7. The terminal section reverse face 512 is exposed from the sealing resin 8, thus constituting a reverse face terminal. The thickness of the terminal section 510 (size in the z-direction) is approximately the same as that of the terminal section 110 of the first lead 1. Here, the terminal section 510 may include a reverse face recess, where a part of the terminal section 510 is recessed from the terminal section reverse face 512 in the z-direction, for example formed by a half etching process. The terminal section end face 513 is connected to the terminal section obverse face 511 and the terminal section reverse face 512, and oriented to the outer side in the y-direction (lower side in FIG. 3), in other words to the opposite side of the first lead 1. The terminal section end face 513 is exposed from the sealing resin 8, thus constituting a terminal.

The connecting section 520 is connected to the terminal section 510, and has a rectangular shape elongate in the x-direction, as viewed in the z-direction. The connecting section 520 is disposed on the other end face of the terminal section 510 in the x-direction (right end face in FIG. 3). The connecting section 520 includes a connecting section obverse face 521, a connecting section reverse face 522, and a connecting section end face 523. The connecting section obverse face 521 and the connecting section reverse face 522 are arranged to face opposite to each other, in the z-direction. The connecting section obverse face 521 is arranged to face upward, in FIG. 4, FIG. 6, and FIG. 7. The connecting section obverse face 521 and the terminal section obverse face 511 are flush with each other. The connecting section reverse face 522 is arranged to face downward, in FIG. 4, FIG. 6, and FIG. 7. The thickness of the connecting section 520 (size in the z-direction) is approximately half a thickness of the terminal section 510. The connecting section 520 is, for example, formed through a half etching process. The connecting section end face 523 is connected to the connecting section obverse face 521 and the connecting section reverse face 522, and oriented to the outer side in the x-direction. The connecting section end face 523 is exposed from the sealing resin 8 (see FIG. 1 and FIG. 6).

The semiconductor element 7 performs the electrical functions of the semiconductor device A1. The semiconductor element 7 includes a nitride semiconductor which is, in this embodiment, a HEMT including gallium nitride (GaN). The semiconductor element 7 includes an element main body 70, a drain electrode 71, a source electrode 72, gate electrodes 73 and 74, and a reverse face electrode 75. The semiconductor element 7 allows a principal current to flow from the drain electrode 71 to the source electrode 72, or restricts the flow, according to a voltage signal applied to the gate electrodes 73 and 74. In other words, the semiconductor element 7 performs the switching of the principal current.

The element main body 70 includes an element obverse face 7a and an element reverse face 7b. As shown in FIG. 4, FIG. 6, and FIG. 7, the element obverse face 7a and the element reverse face 7b are arranged to face opposite to each other, in the z-direction. The element obverse face 7a is arranged to face upward, in FIG. 4, FIG. 6, and FIG. 7. The element reverse face 7b is arranged to face downward, in FIG. 4, FIG. 6, and FIG. 7. As shown in FIG. 9, the element main body 70 includes a substrate 701, a buffer layer 702, a first nitride semiconductor layer 703, a second nitride semiconductor layer 704, a third nitride semiconductor layer 705, a protective film 706, wirings 709, and a conductive section 707. The wirings 709 include wirings 709a, 709b, and 709c.

The substrate 701 is, for example, a low-resistance Si substrate. The thickness of the substrate 701 (size in the z-direction) is approximately 250 to 400 μm. The buffer layer 702 includes a plurality of buffer layers of nitride semiconductor film, formed on the substrate 701. In this embodiment, the buffer layer 702 includes a first buffer layer formed of an AlN film in contact with the substrate 701, and a second buffer layer formed of an AlGaN film, stacked on the first buffer layer. The second buffer layer may have a superlattice structure including AlN films and GaN films alternately stacked. The first nitride semiconductor layer 703 includes a GaN layer formed on the buffer layer 702 by epitaxial growth, and constitutes an electron transit layer. The second nitride semiconductor layer 704 includes an AlGaN layer formed on the first nitride semiconductor layer 703 by epitaxial growth, and constitutes an electron supply layer. The total thickness of the buffer layer 702, the first nitride semiconductor layer 703, and the second nitride semiconductor layer 704 (size in the z-direction) is approximately 2 μm, which is thinner than the substrate 701. Two-dimensional electron gas (2DEG) generated in the vicinity of the interface between the first nitride semiconductor layer 703 and the second nitride semiconductor layer 704 is utilized as the electrical conduction path.

The third nitride semiconductor layer 705 includes a P-type GaN layer formed on the second nitride semiconductor layer 704 by epitaxial growth. The wiring 709a is formed on the third nitride semiconductor layer 705. The protective film 706 is, for example, formed of a SiN film, and covers the second nitride semiconductor layer 704, the third nitride semiconductor layer 705, and the wiring 709a. A part of the wiring 709a is exposed from the protective film 706, and connected to the gate electrodes 73 and 74. The gate electrodes 73 and 74 act as the gate electrode of the semiconductor element 7. On the protective film 706, the wirings 709b and 709c are provided. The wirings 709b and 709c are spaced from each other, and a part of each of the wirings penetrates through the protective film 706, so as to contact the second nitride semiconductor layer 704. The wiring 709b is formed so as to cover the third nitride semiconductor layer 705 and the wiring 709a, and connected to the source electrode 72. The source electrode 72 acts as the source electrode of the semiconductor element 7. The wiring 709c is formed adjacent to the wiring 709b, and connected to the drain electrode 71. The drain electrode 71 acts as the drain electrode of the semiconductor element 7.

As shown in FIG. 8, the drain electrode 71, the source electrode 72, the gate electrode 73, and the gate electrode 74 are disposed on the element obverse face 7a. The electrodes 71 to 74 are spaced from one another, and disposed so as to correspond to the positions of the leads 1 to 5. The drain electrode 71 is disposed on one side of the element obverse face 7a in the y-direction (lower side in FIG. 8), and extends all the way in the x-direction. The drain electrode 71 includes a belt-like section 711 and three extended sections 712. The belt-like section 711 has a rectangular shape elongate in the x-direction, as viewed in the z-direction, and is disposed along an end portion of the element obverse face 7a in the y-direction. The extended sections 712 extend in the y-direction, from both ends and the center of the belt-like section 711 in the x-direction, and each have a rectangular shape elongate in the y-direction, as viewed in the z-direction. The source electrode 72 is disposed on the other side of the element obverse face 7a in the y-direction (upper side in FIG. 8), and at the center of the element obverse face 7a in the x-direction. The source electrode 72 includes a belt-like section 721 and two extended sections 722. The belt-like section 721 has a rectangular shape elongate in the x-direction, as viewed in the z-direction, and is disposed along the other end portion of the element obverse face 7a in the y-direction. The extended sections 722 extend in the y-direction from the respective ends of the belt-like section 721 in the x-direction, and each have a rectangular shape elongate in the y-direction, as viewed in the z-direction. The extended sections 722 are each disposed between two of the extended sections 712. In other words, the extended sections 712 and the extended sections 722 are alternately aligned in the x-direction. The gate electrode 73 is disposed on the other side of the element obverse face 7a in the y-direction, and on one side thereof in the x-direction (left side in FIG. 8). The gate electrode 73 has a rectangular shape elongate in the x-direction, as viewed in the z-direction. The gate electrode 74 is disposed on the other side of the element obverse face 7a in the y-direction, and on the other side thereof in the x-direction (right side in FIG. 8). The gate electrode 74 has a rectangular shape elongate in the x-direction, as viewed in the z-direction. Here, the locations and the shapes of the electrodes 71 to 74 are not specifically limited, but may be designed in accordance with the locations and the shapes of the leads 1 to 5.

The reverse face electrode 75 is provided on the reverse face of the substrate 701 (on the opposite side of the face on which the buffer layer 702 is formed), and disposed on the element reverse face 7b.

The conductive section 707 is a via hole for example, and penetrating through the second nitride semiconductor layer 704, the first nitride semiconductor layer 703, and the buffer layer 702, so as to reach the substrate 701. The conductive section 707 is disposed in contact with the wiring 709b penetrating through the protective film 706, and therefore electrically connected to the wiring 709b, and also electrically connected to the reverse face electrode 75, via the substrate 701. Accordingly, the source electrode 72 and the reverse face electrode 75 are electrically connected to each other, thus being equipotential with each other. The conductive section 707 may also penetrate through the substrate 701, so as to reach the reverse face electrode 75. Further, as will be subsequently described, the source electrode 72 and the reverse face electrode 75 are electrically connected to each other via the second lead 2 and the connection lead 6, thus being equipotential, and therefore it is not mandatory that the semiconductor element 7 includes the conductive section 707.

The semiconductor element 7 is flip-chip bonded on the first lead 1, the second lead 2, the fourth lead 4, and the fifth lead 5. In other words, the semiconductor element 7 is bonded to the leads 1, 2, 4, and 5 via a non-illustrated conductive bonding material, with the element obverse face 7a oriented to the respective obverse faces of the leads 1, 2, 4, and 5. The semiconductor element 7 overlaps with the extended section 130 of the first lead 1 and the extended section 230 of the second lead 2, and a part of each of the terminal section 110 of the first lead 1, the supporting section 210 of the second lead 2, the terminal section 410 of the fourth lead 4, and the terminal section 510 of the fifth lead 5, as viewed in the z-direction. In other words, the semiconductor element 7 is supported by the extended section 130 and the extended section 230, and a part of each of the terminal section 110, the supporting section 210, the terminal section 410, and the terminal section 510.

The drain electrode 71 is bonded to the first lead 1. To be more detailed, the belt-like section 711 of the drain electrode 71 is bonded to the terminal section obverse face 111 of the first lead 1, and the extended sections 712 of the drain electrode 71 are bonded to the respective extended section obverse faces 131 of the first lead 1. Accordingly, the first lead 1 is electrically connected to the drain electrode 71 of the semiconductor element 7, and acts as the drain terminal of the semiconductor element 7. The source electrode 72 is bonded to the second lead 2. To be more detailed, the belt-like section 721 of the source electrode 72 is bonded to the supporting section obverse face 211 of the second lead 2, and the extended sections 722 of the source electrode 72 are bonded to the respective extended section obverse face 231 of the second lead 2. Further, as will be subsequently described, the second lead 2 is electrically connected to the third lead 3, via the connection lead 6. Accordingly, the third lead 3 is electrically connected to the source electrode 72 of the semiconductor element 7, and acts as the source terminal of the semiconductor element 7. The gate electrode 73 is bonded to the terminal section obverse face 411 of the fourth lead 4. Accordingly, the fourth lead 4 is electrically connected to the gate electrode 73 of the semiconductor element 7, and acts as the gate terminal of the semiconductor element 7. Likewise, the gate electrode 74 is bonded to the terminal section obverse face 511 of the fifth lead 5. Accordingly, the fifth lead 5 is electrically connected to the gate electrode 74 of the semiconductor element 7, and acts as the gate terminal of the semiconductor element 7.

The connection lead 6 electrically connects the second lead 2 and the third lead 3, thereby constituting the current path for the principal current. The connection lead 6 is formed of a metal plate, preferably one of Cu and Ni, an alloy thereof, or a 42-alloy. In this embodiment, it will be assumed that the connection lead 6 is formed of Cu. The thickness of the connection lead 6 may be, for example, 0.08 to 1 mm, and is approximately 0.5 mm in this embodiment. The connection lead 6 may be formed, for example, by punching or bending a metal plate. The connection lead 6 includes a first plate-shaped section 61, a second plate-shaped section 62, and a third plate-shaped section 63.

As shown in FIG. 1, the first plate-shaped section 61 has a generally rectangular plate shape, and is disposed on the side of the element reverse face 7b of the semiconductor element 7, so as to extend in a direction orthogonal to the z-direction. A part of the first plate-shaped section 61 overlaps with the semiconductor element 7, as viewed in the z-direction. In addition, the first plate-shaped section 61 overlaps with the first lead 1, the second lead 2, and the third lead 3, as viewed in the z-direction. The semiconductor element 7 is interposed between the first plate-shaped section 61, and the first and second leads 1 and 2, as viewed in the z-direction. The first plate-shaped section 61 includes a first plate-shaped section obverse face 61a and a first plate-shaped section reverse face 61b. The first plate-shaped section obverse face 61a and the first plate-shaped section reverse face 61b are arranged to face opposite to each other, in the z-direction. The first plate-shaped section obverse face 61a is arranged to face upward, in FIG. 4, FIG. 6, and FIG. 7. The first plate-shaped section obverse face 61a is exposed from the sealing resin 8. The first plate-shaped section reverse face 61b is arranged to face downward, in FIG. 4, FIG. 6, and FIG. 7. The first plate-shaped section reverse face 61b is disposed in contact with the element reverse face 7b of the semiconductor element 7, and bonded thereto via a non-illustrated conductive bonding material. The reverse face electrode 75 formed on the element reverse face 7b is bonded to the first plate-shaped section reverse face 61b, via a conductive bonding material. The first plate-shaped section 61 is connected to the second plate-shaped section 62 and the third plate-shaped section 63, at the respective end portions in the y-direction. The size in the x-direction of end the portion of the first plate-shaped section 61, connected to the second plate-shaped section 62, accords with the size of the second plate-shaped section 62 in the x-direction, and the size in the x-direction of the end portion of the first plate-shaped section 61, connected to the third plate-shaped section 63, accords with the size of the third plate-shaped section 63 in the x-direction.

The second plate-shaped section 62 has a generally rectangular plate shape, and is disposed on one side of the semiconductor element 7 in the y-direction (left side in FIG. 6 and FIG. 7), so as to extend parallel to the z-direction and the x-direction. The end portion of the second plate-shaped section 62 on one side in the z-direction (upper end in FIG. 6 and FIG. 7) is connected to the first plate-shaped section 61. The first plate-shaped section 61 and the second plate-shaped section 62 are orthogonal to each other. The end portion of the second plate-shaped section 62 on the other side in the z-direction (lower end in FIG. 6 and FIG. 7) is connected to the supporting section obverse face 211 of the second lead 2, via a non-illustrated conductive bonding material. The second plate-shaped section 62 and the second lead 2 are orthogonal to each other. The second plate-shaped section 62 is covered with the sealing resin 8, without being exposed from the resin side face 83.

The third plate-shaped section 63 has a generally rectangular plate shape, and is disposed on the other side of the semiconductor element 7 in the y-direction (right side in FIG. 6 and FIG. 7), so as to extend parallel to the z-direction and the x-direction. The end portion of the third plate-shaped section 63 on one side in the z-direction (upper end in FIG. 6 and FIG. 7) is connected to the first plate-shaped section 61. The first plate-shaped section 61 and the third plate-shaped section 63 are orthogonal to each other. The end portion of the third plate-shaped section 63 on the other side in the z-direction (lower end in FIG. 6 and FIG. 7) is connected to the terminal section obverse face 311 of the third lead 3, via a non-illustrated conductive bonding material. The third plate-shaped section 63 and the third lead 3 are orthogonal to each other. The third plate-shaped section 63 is covered with the sealing resin 8, without being exposed from the resin side face 83.

When power is supplied to the semiconductor element 7, the current flows in the semiconductor device A1, as indicated by broken-line arrows in FIG. 7. To be more detailed, the current is inputted through the first lead 1, serving as the drain terminal, and flows therefrom to the drain electrode 71 of the semiconductor element 7. The current then flows inside the semiconductor element 7, from the drain electrode 71 to the source electrode 72. Although the current flows in various directions inside the semiconductor element 7, such currents cancel each other and, as a whole, the current flows as indicated by the broken-line arrow drawn inside the semiconductor element 7 shown in FIG. 7. The current outputted from the source electrode 72 flows through the second lead 2 and the connection lead 6, and is outputted from the third lead 3, serving as the source terminal.

The sealing resin 8 covers a part of each of the leads 1 to 5 and the connection lead 6, and the semiconductor element 7. The sealing resin 8 is, for example, formed of a black epoxy resin.

The sealing resin 8 includes a resin obverse face 81, a resin reverse face 82, and a resin side face 83. The resin obverse face 81 and the resin reverse face 82 are arranged to face opposite to each other, in the z-direction. The resin obverse face 81 is arranged to face upward in FIG. 4, FIG. 6, and FIG. 7, and the resin reverse face 82 is arranged to face downward in FIG. 4, FIG. 6, and FIG. 7. The resin side face 83 is connected to the resin obverse face 81 and the resin reverse face 82, and oriented in the x-direction or y-direction.

In this embodiment, first lead 1 (J) the connecting section end face 123 of the first lead 1, the supporting section end face 213 of the second lead 2, the terminal section end face 313 and the connecting section end face 323 of the third lead 3, the terminal section end face 413 and the connecting section end face 423 of the fourth lead 4, and the terminal section end face 513 and the connecting section end face 523 of the fifth lead 5 are flush with the resin side face 83 of the sealing resin 8. In addition, the terminal section reverse face 112 of the first lead 1, the terminal section reverse face 312 of the third lead 3, the terminal section reverse face 412 of the fourth lead 4, and the terminal section reverse face 512 of the fifth lead 5 are flush with the resin reverse face 82 of the sealing resin 8. Further, the first plate-shaped section obverse face 61a of the connection lead 6 is flush with the resin obverse face 81 of the sealing resin 8.

A manufacturing method of the semiconductor device A1 will be described below.

First, a lead frame is prepared. The lead frame is a plate-shaped material to be formed into each of the leads 1 to 5. The regions of the lead frame to be formed into the connecting section 120 and the extended section 130 of the first lead 1, the supporting section 210 and the extended section 230 of the second lead 2, the connecting section 320 of the third lead 3, the connecting section 420 of the fourth lead 4, and the connecting section 520 of the fifth lead 5 are formed in a reduced thickness (size in the z-direction) compared with the remaining regions, for example through a half etching process. In this embodiment, Cu is employed as the mother material of the lead frame.

Then the semiconductor element 7 is flip-chip bonded at a predetermined position on the lead frame, via a conductive bonding material. The connection lead 6, formed in a separate process, is disposed so as to stride over the semiconductor element 7, and bonded to the region of the lead frame to be formed into the second lead 2 and the third lead 3, and the element reverse face 7b of the semiconductor element 7, via the conductive bonding material.

Then the sealing resin is formed by curing a resin material, so as to cover the semiconductor element 7, a part of the lead frame, and a part of the connection lead 6. The lead frame and the sealing resin are then cut, along cutting lines. As result, individual pieces, each of which is to be formed into the semiconductor device A1, can be obtained. Through the mentioned process, the semiconductor device A1 configured as above can be obtained.

The semiconductor device A1 provides the following advantages.

With the configuration according to this embodiment, when power is supplied to the semiconductor element 7, the principal current to be subjected to the switching is inputted through the first lead 1, serving as the drain terminal, flows therefrom to the drain electrode 71 of the semiconductor element 7, and flows inside the semiconductor element 7, from the drain electrode 71 to the source electrode 72. The principal current outputted from the source electrode 72 flows through the second lead 2 and the connection lead 6, and is outputted from the third lead 3, serving as the source terminal. The semiconductor element 7 is flip-chip bonded, the drain electrode 71 is bonded to the first lead 1, and the source electrode 72 is bonded to the second lead 2. Accordingly, the current path is shortened compared with the case of employing bonding wires for the connection, and therefore the inductance can be reduced. In addition, the connection lead 6 is disposed such that the first plate-shaped section 61 partially overlaps with the semiconductor element 7 on the side of the element reverse face 7b, as viewed in the z-direction, and connected to the second lead 2 and the third lead 3. Therefore, the principal current flows through the connection lead 6, in the direction opposite to the flow direction in the current path from the first lead 1 to the second lead 2. Accordingly, the magnetic field generated by the principal current flowing through the current path from the first lead 1 to the second lead 2, and the magnetic field generated by the principal current flowing through the connection lead 6 cancel each other, and consequently the generation of the inductance can be suppressed.

According to this embodiment, the first plate-shaped section 61 of the connection lead 6 is disposed such that the first plate-shaped section reverse face 61b is bonded to the element reverse face 7b of the semiconductor element 7, and the first plate-shaped section obverse face 61a is exposed from the sealing resin 8. In other words, the first plate-shaped section 61 serves as a heat dissipating plate that releases the heat generated by the semiconductor element 7. As result, an increase in temperature of the semiconductor element 7 can be suppressed. In addition, the connection lead 6 also serves as a shielding plate against noise generated by the semiconductor element 7. Therefore, the noise emission from the semiconductor device A1 can be suppressed.

According to this embodiment, further, the first lead 1 includes the extended section 130, and the second lead 2 includes the extended section 230. Therefore, the semiconductor element 7 is properly supported, which assures the electrical connection between the drain electrode 71 and the first lead 1, and between the source electrode 72 and the second lead 2. In addition, the extended section 130 and the extended section 230 are not exposed from the resin reverse face 82. Such a configuration keeps the extended section 130 and the extended section 230 from being connected via a solder paste, when the semiconductor device A1 is mounted, thereby preventing a short circuit between the first lead 1 and the second lead 2.

Although it is assumed that the semiconductor element 7 is a HEMT in this embodiment, the present disclosure is not limited thereto. It suffices that the semiconductor element 7 includes the drain electrode 71 and the source electrode 72 disposed on the same face, and allows the principal current to flow inside the semiconductor element 7 in a direction orthogonal to the z-direction.

Further, although the first plate-shaped section reverse face 61b is bonded to the element reverse face 7b of the semiconductor element 7 in this embodiment, the present disclosure is not limited to such a configuration. It is not mandatory that the first plate-shaped section reverse face 61b is bonded to the element reverse face 7b, and the sealing resin 8 may be filled in, between the first plate-shaped section reverse face 61b and the element reverse face 7b.

Figure 10:
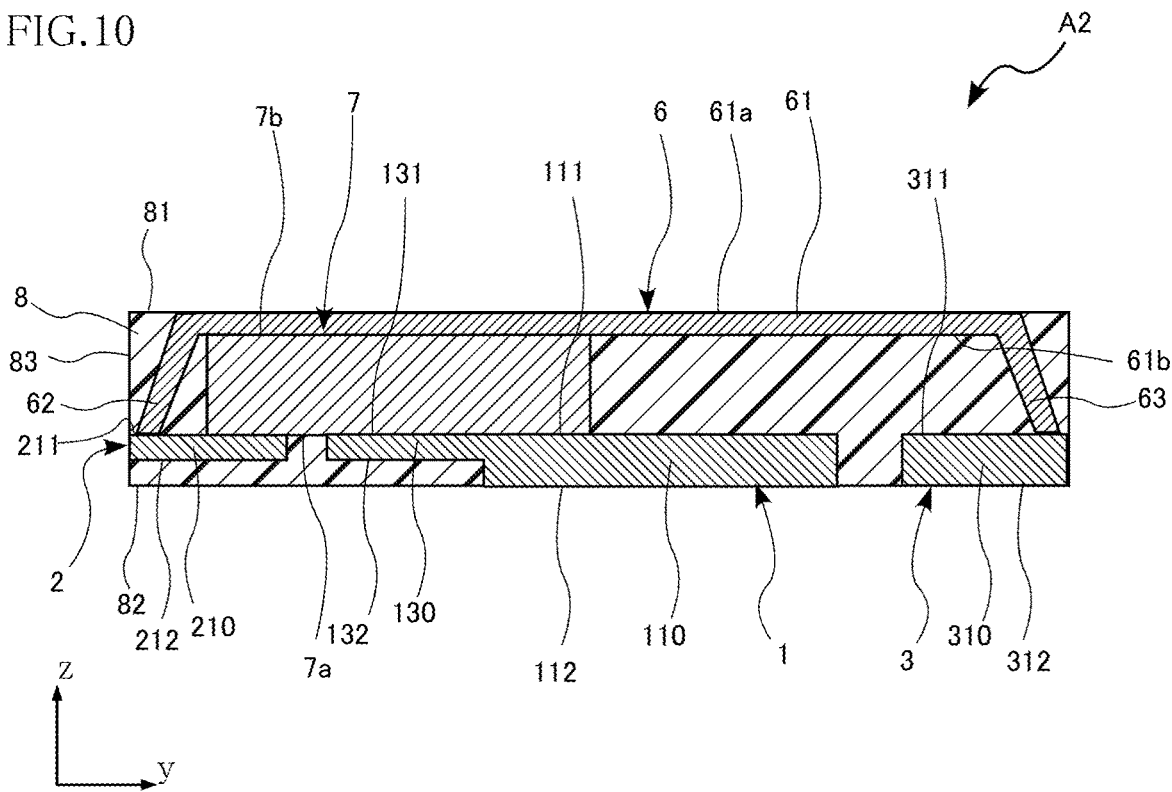
FIG. 10 is a cross-sectional view showing a semiconductor device according to a second embodiment.

Referring now to FIG. 10, a semiconductor device A2 according to a second embodiment of the present disclosure will be described hereunder. In FIG. 10, the elements same as or similar to those of the semiconductor device A1 are given the same numeral, and the description of such elements will not be repeated.

FIG. 10 is a cross-sectional view of the semiconductor device A2, corresponding to FIG. 7 showing the first embodiment.

The semiconductor device A2 according to this embodiment is different from the semiconductor device A1, in the shape of the connection lead 6. In the connection lead 6 according to the second embodiment, the second plate-shaped section 62 and the third plate-shaped section 63 are inclined with respect to the z-direction.

In this embodiment also, since the semiconductor element 7 is flip-chip bonded, the inductance can be reduced. In addition, the principal current flows through the connection lead 6, in the direction opposite to the flow direction in the current path from the first lead 1 to the second lead 2. Accordingly, the magnetic fields cancel each other, so that the generation of the inductance can be suppressed. Therefore, this embodiment also provides the advantages similar to those provided by the first embodiment.

Figure 11:
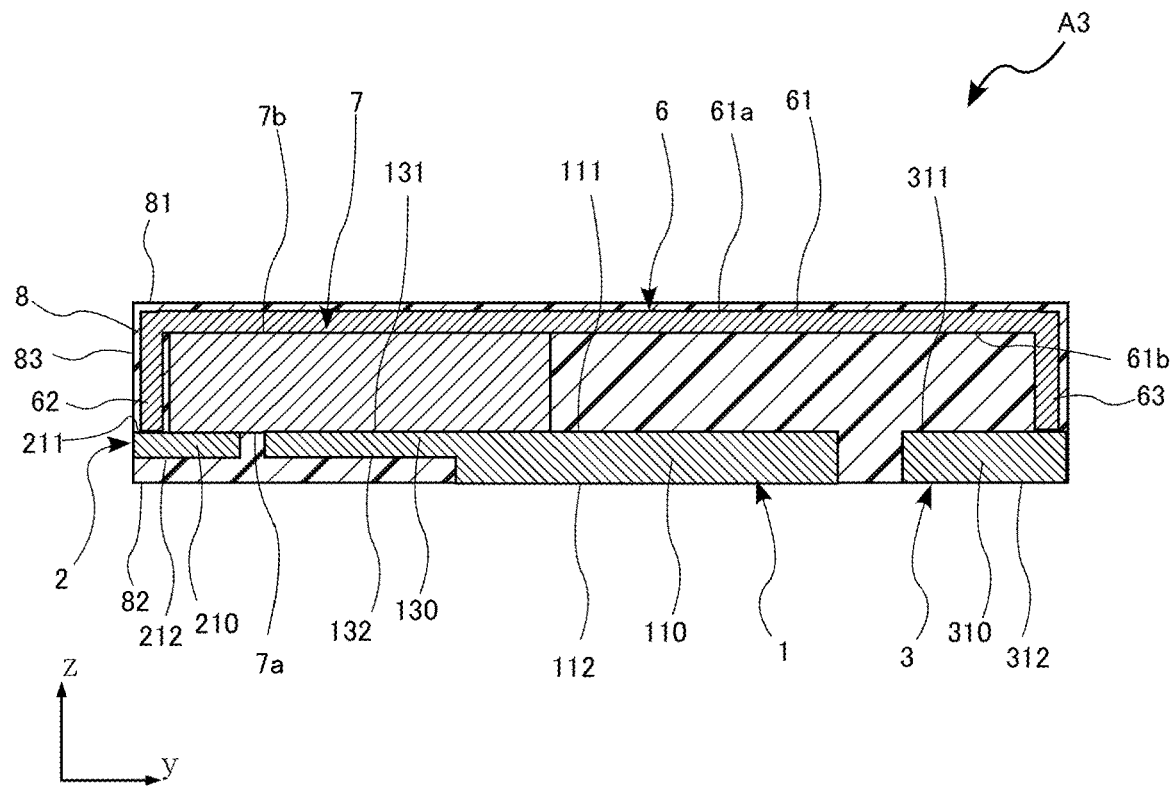
FIG. 11 is a cross-sectional view showing a semiconductor device according to a third embodiment.

Referring to FIG. 11, a semiconductor device A3 according to a third embodiment of the present disclosure will be described hereunder. In FIG. 11, the elements same as or similar to those of the semiconductor device A1 are given the same numeral, and the description of such elements will not be repeated.

FIG. 11 is a cross-sectional view of the semiconductor device A3, corresponding to FIG. 7 showing the first embodiment.

The semiconductor device A3 according to this embodiment is different from the semiconductor device A1, in that the first plate-shaped section obverse face 61a is not exposed from the resin obverse face 81 of the sealing resin 8. The connection lead 6 according to the third embodiment is covered with the sealing resin 8, in its entirety.

In this embodiment also, since the semiconductor element 7 is flip-chip bonded, the inductance can be reduced. In addition, the principal current flows through the connection lead 6, in the direction opposite to the flow direction in the current path from the first lead 1 to the second lead 2. Accordingly, the magnetic fields cancel each other, so that the generation of the inductance can be suppressed. Further, the connection lead 6 serves as the shielding plate against the noise generated by the semiconductor element 7, and therefore noise emission from the semiconductor device A1 can be suppressed.

Figure 12:
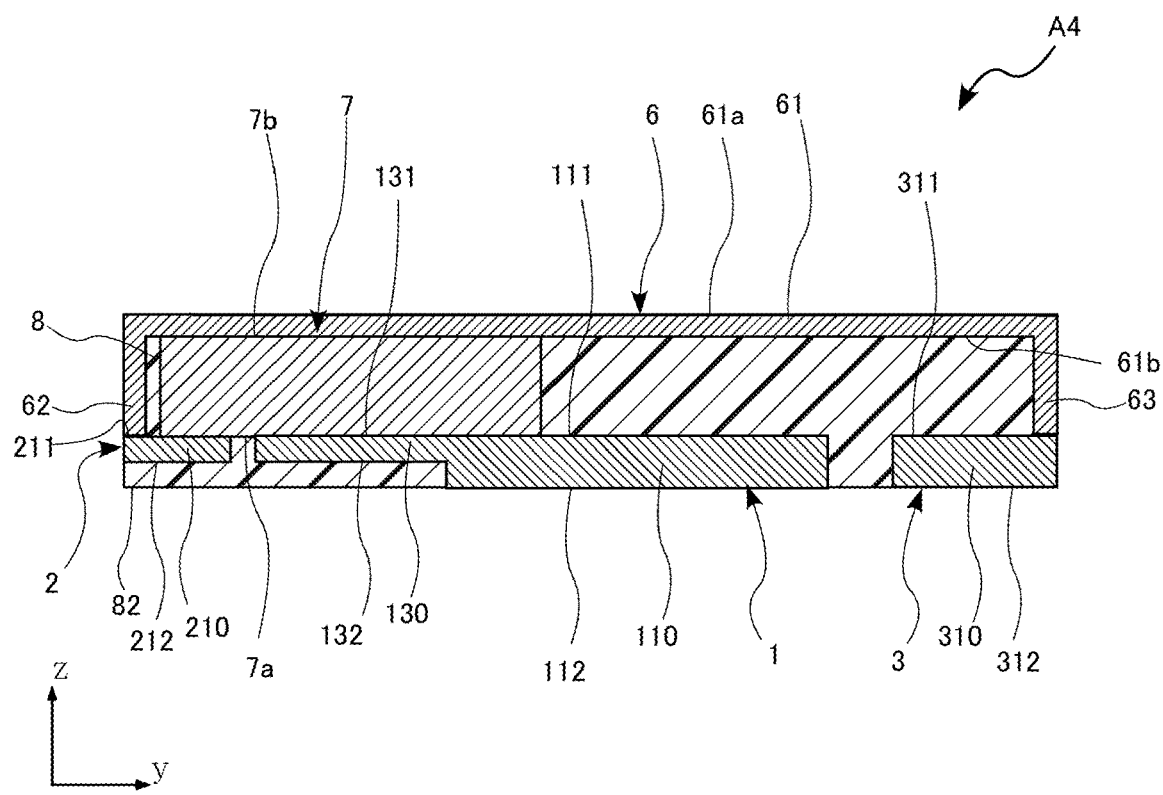
FIG. 12 is a cross-sectional view showing a semiconductor device according to a fourth embodiment.

Referring to FIG. 12, a semiconductor device A4 according to a fourth embodiment of the present disclosure will be described hereunder. In FIG. 12, the elements same as or similar to those of the semiconductor device A1 are given the same numeral, and the description of such elements will not be repeated.

FIG. 12 is a cross-sectional view of the semiconductor device A4, corresponding to FIG. 7 showing the first embodiment.

The semiconductor device A4 according to this embodiment is different from the semiconductor device A1, in that the second plate-shaped section 62 and the third plate-shaped section 63 of the connection lead 6 are exposed from the resin side face 83.

This embodiment also provides the advantages similar to those provided by the first embodiment. According to this embodiment, further, since the second plate-shaped section 62 and the third plate-shaped section 63 of the connection lead 6 are also exposed from the resin side face 83, the heat dissipation performance can be further improved.

Figure 13:
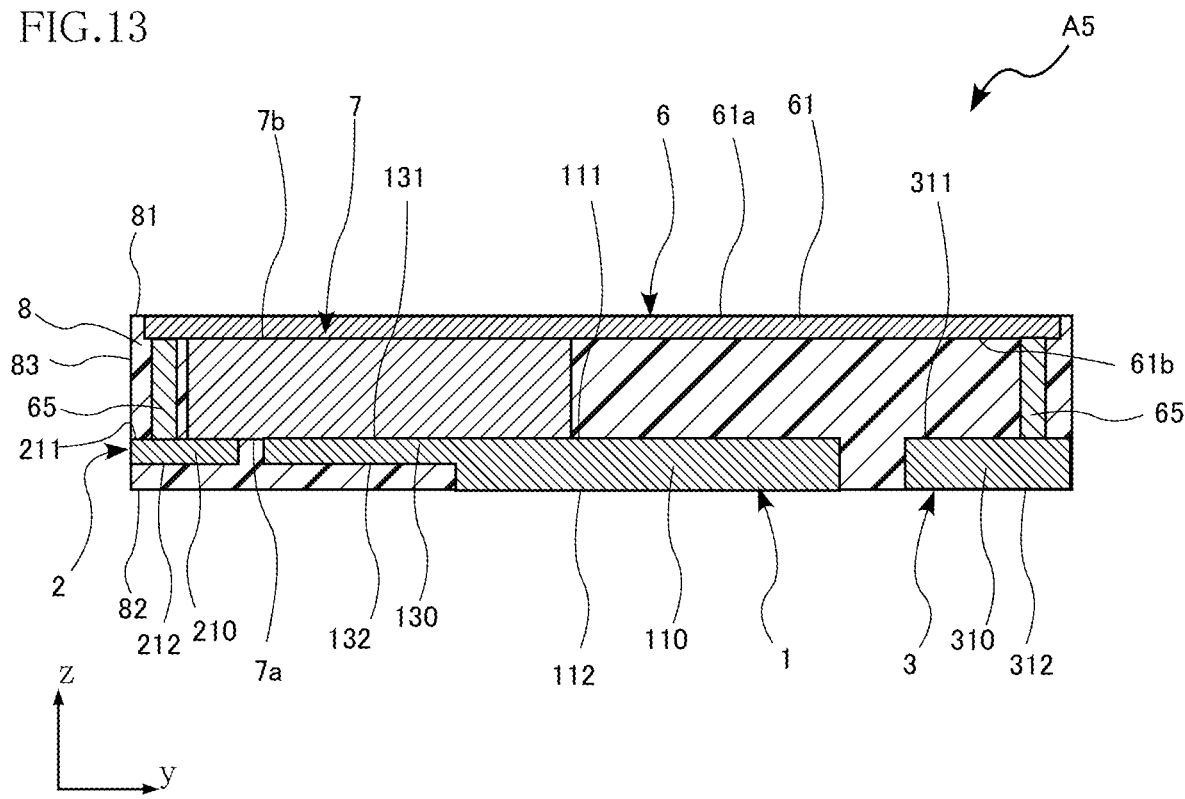
FIG. 13 is a cross-sectional view showing a semiconductor device according to a fifth embodiment.
Figure 14:
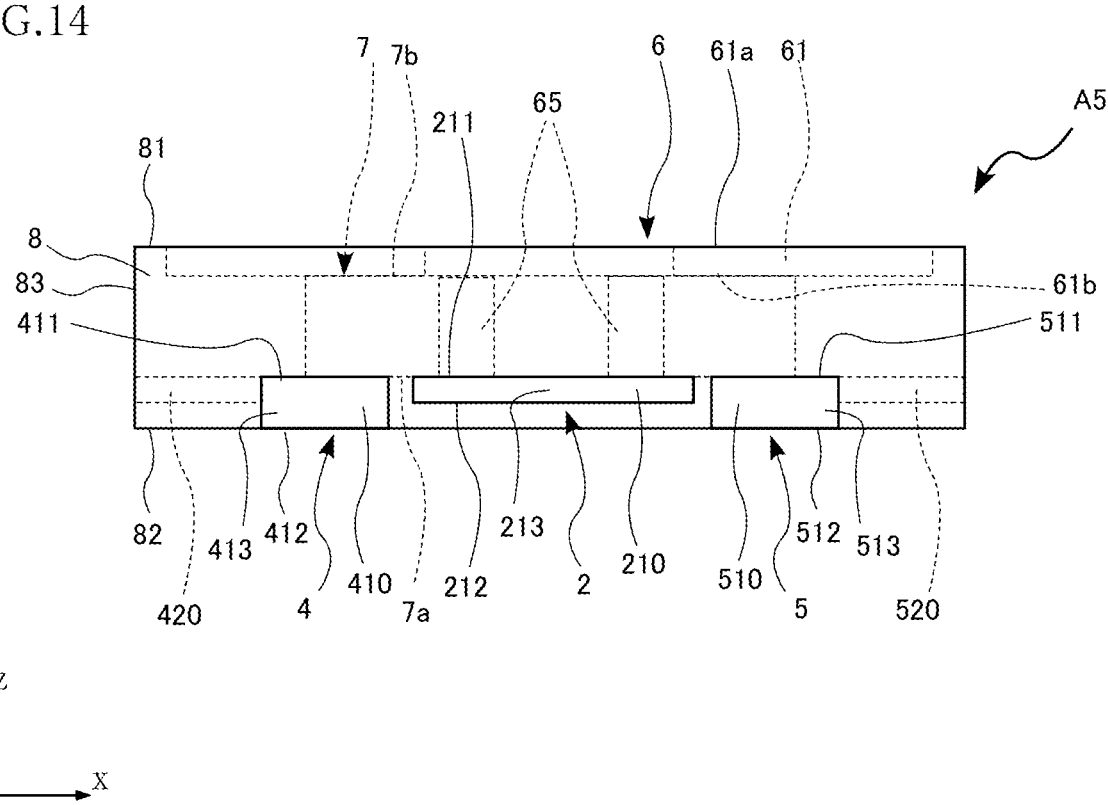
FIG. 14 is a front view showing the semiconductor device according to the fifth embodiment.

Referring to FIG. 13 and FIG. 14, a semiconductor device A5 according to a fifth embodiment of the present disclosure will be described hereunder. In FIG. 13 and FIG. 14, the elements same as or similar to those of the semiconductor device A1 are given the same numeral, and the description of such elements will not be repeated.

FIG. 13 is a cross-sectional view of the semiconductor device A5, corresponding to FIG. 7 showing the first embodiment. FIG. 14 is a front view of the semiconductor device A5, corresponding to FIG. 4 showing the first embodiment.

The semiconductor device A5 according to this embodiment is different from the semiconductor device A1, in the connection method between the connection lead 6, and the second and third leads 2 and 3.

The connection lead 6 according to the fifth embodiment has no second plate-shaped section 62 and no third plate-shaped section 63, and only includes the first plate-shaped section 61. The connection lead 6 and each of the second and third leads 2 and 3 are connected via a pair of columnar sections 65. The columnar section 65 is a conductor electrically connecting between the connection lead 6, and the second and third leads 2 and 3. In this embodiment, the columnar section 65 is formed in a rectangular column shape, having a rectangular cross-sectional shape in a direction orthogonal to the z-direction. However, the shape of the columnar section 65 is not limited thereto, but may be, for example, a circular column shape. One end of the columnar section 65 in the z-direction (upper end in FIG. 13 and FIG. 14) is connected to the first plate-shaped section 61, via a non-illustrated conductive bonding material. The other end of the columnar section 65 in the z-direction (lower end in FIG. 13 and FIG. 14) is connected to the supporting section obverse face 211 of the second lead 2, or the terminal section obverse face 311 of the third lead 3, via the non-illustrated conductive bonding material. In this embodiment, the columnar section 65 is, for example, formed of Cu. However, the material, the formation method, the shape, and the number of pieces of the columnar sections 65 are not specifically limited.

This embodiment also provides the advantages similar to those provided by the first embodiment. Here, although the connection lead 6 and the second and third leads 2 and 3 are connected via the columnar sections 65 in this embodiment, the present disclosure is not limited to such a configuration. The connection lead 6 and the second and third leads 2 and 3 may be connected via a different conductive material, such as a bonding wire.

Figure 15:
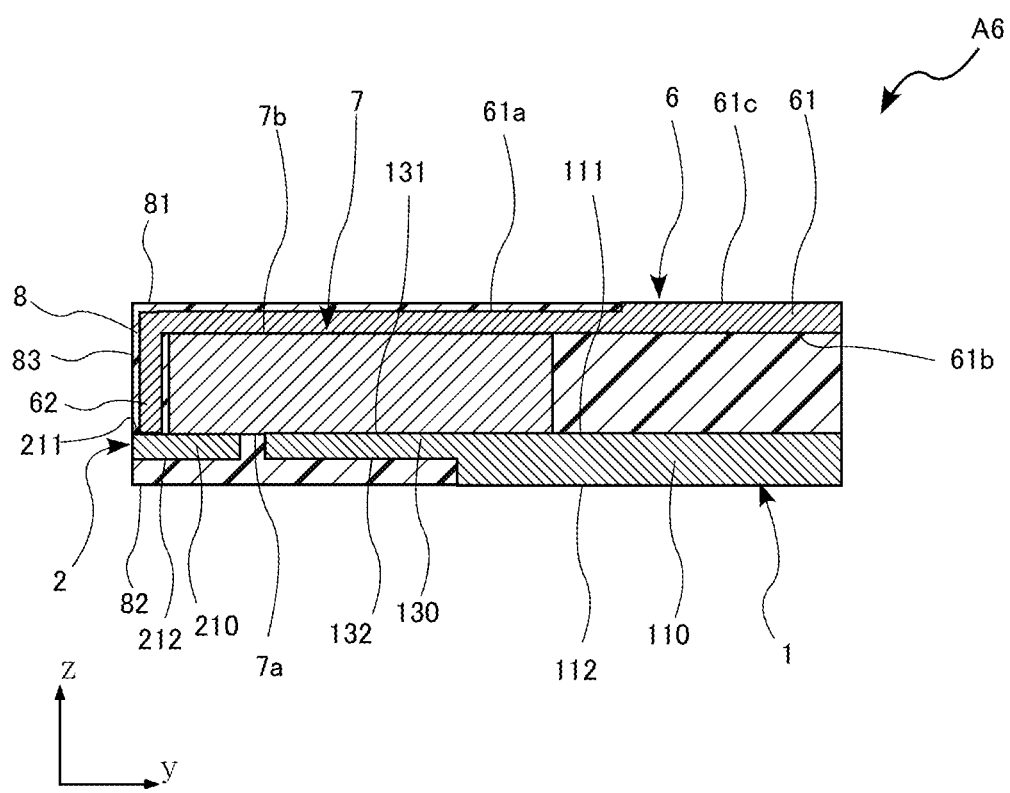
FIG. 15 is a cross-sectional view showing a semiconductor device according to a sixth embodiment.

Referring to FIG. 15, a semiconductor device A6 according to a sixth embodiment of the present disclosure will be described hereunder. In FIG. 15, the elements same as or similar to those of the semiconductor device A1 are given the same numeral, and the description of such elements will not be repeated.

FIG. 15 is a cross-sectional view of the semiconductor device A6, corresponding to FIG. 7 showing the first embodiment.

The semiconductor device A6 according to this embodiment is different from the semiconductor device A1, in that the source terminal is disposed on the face opposite to the drain terminal (first lead 1).

The semiconductor device A6 according to the sixth embodiment has no second lead 2. In addition, the connection lead 6 according to the sixth embodiment has no third plate-shaped section 63. The first plate-shaped section 61 of the connection lead 6 includes an elevated face 61c protruding from the first plate-shaped section obverse face 61a in the z-direction. The first plate-shaped section obverse face 61a is covered with the sealing resin 8. In contrast, the elevated face 61c is exposed from the sealing resin 8, and flush with the resin obverse face 81. The elevated face 61c, exposed from the sealing resin 8, serves as the source terminal.

This embodiment also provides the advantages similar to those provided by the first embodiment. According to this embodiment, further, since the second lead 2 is not provided, the size in the y-direction can be reduced.

Figure 16:
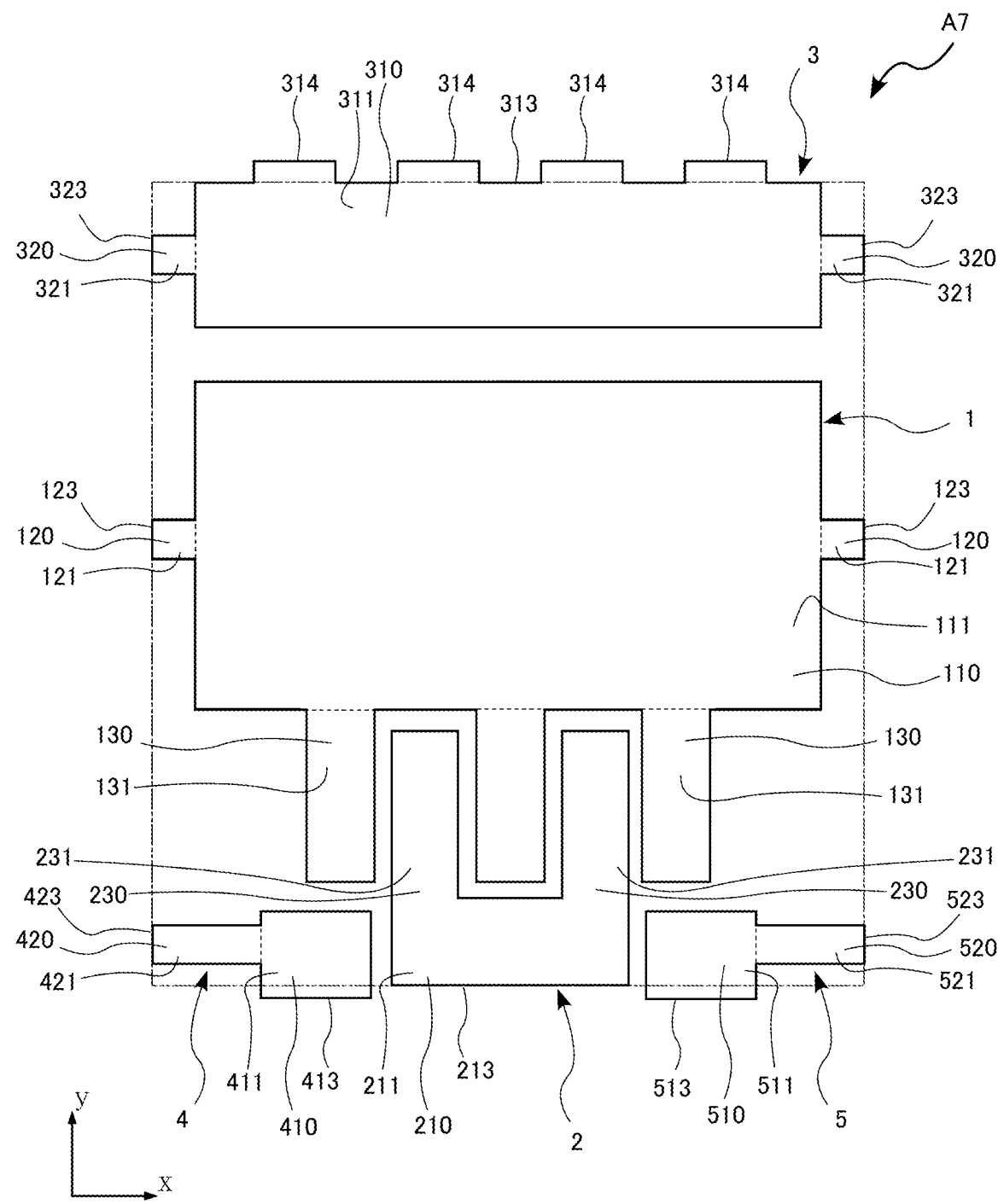
FIG. 16 is a plan view showing a semiconductor device according to a seventh embodiment.
Figure 17:
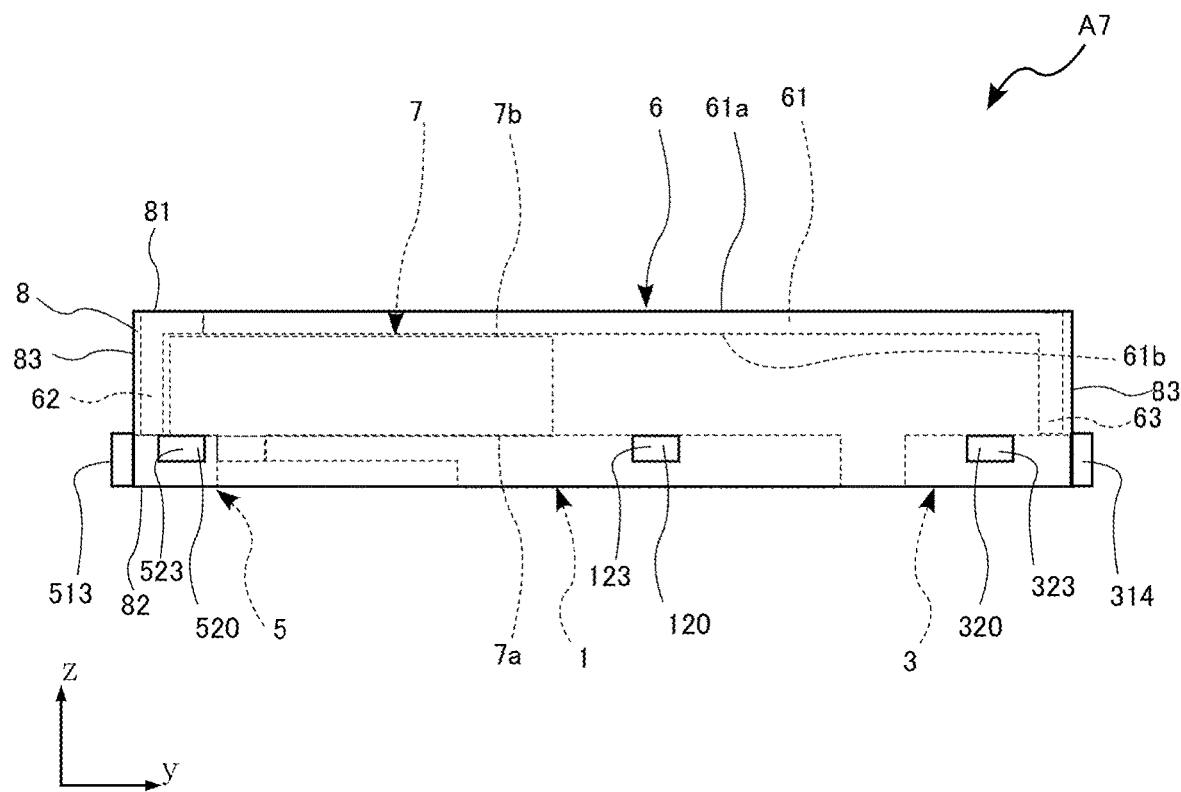
FIG. 17 is a right-side view showing the semiconductor device according to the seventh embodiment.

Referring to FIG. 16 and FIG. 17, a semiconductor device A7 according to a seventh embodiment of the present disclosure will be described hereunder. In FIG. 16 and FIG. 17, the elements same as or similar to those of the semiconductor device A1 are given the same numeral, and the description of such elements will not be repeated.

FIG. 16 is a plan view of the semiconductor device A7, corresponding to FIG. 3 showing the first embodiment. For the sake of clarity, FIG. 16 illustrates a view seen through the sealing resin 8, the connection lead 6, and the semiconductor element 7, indicating the outline of the sealing resin 8 by imaginary lines (dash-dot-dot lines). FIG. 17 is a right side view of the semiconductor device A7, corresponding to FIG. 6 showing the first embodiment.

The semiconductor device A7 according to this embodiment is different from the semiconductor device A1, in the shape of the gate terminal (fourth lead 4 and fifth lead 5) and the source terminal (third lead 3).

The third lead 3 according to the seventh embodiment includes protruding sections 314, protruding from the terminal section end face 313 in the y-direction. The protruding sections 314 each have a rectangular shape elongate in the x-direction, as viewed in the z-direction. Four of such protruding sections 314 are aligned in the x-direction at regular intervals, along the end face of the terminal section 310 oriented to the outer side in the y-direction. Here the number of pieces of the protruding sections 314 is not specifically limited.

In the seventh embodiment, further, the terminal section end face 413 of the fourth lead 4 and the terminal section end face 513 of the fifth lead 5 are not flush with the resin side face 83, but protruding therefrom.

This embodiment also provides the advantages similar to those provided by the first embodiment. Here, the terminal section end face 413 of the fourth lead 4 and the terminal section end face 513 of the fifth lead 5 may be recessed from the resin side face 83. Further, the mentioned end faces may each be flat, curved, or uneven. The shape of each of those end faces is not specifically limited. Further, the terminal section end face 313 of the third lead 3 may be covered with the resin side face 83, and the protruding section 314 may be exposed from the resin side face 83. The third lead 3 may be without the protruding section 314, and the terminal section end face 313 may be covered with the resin side face 83.

Figure 18:
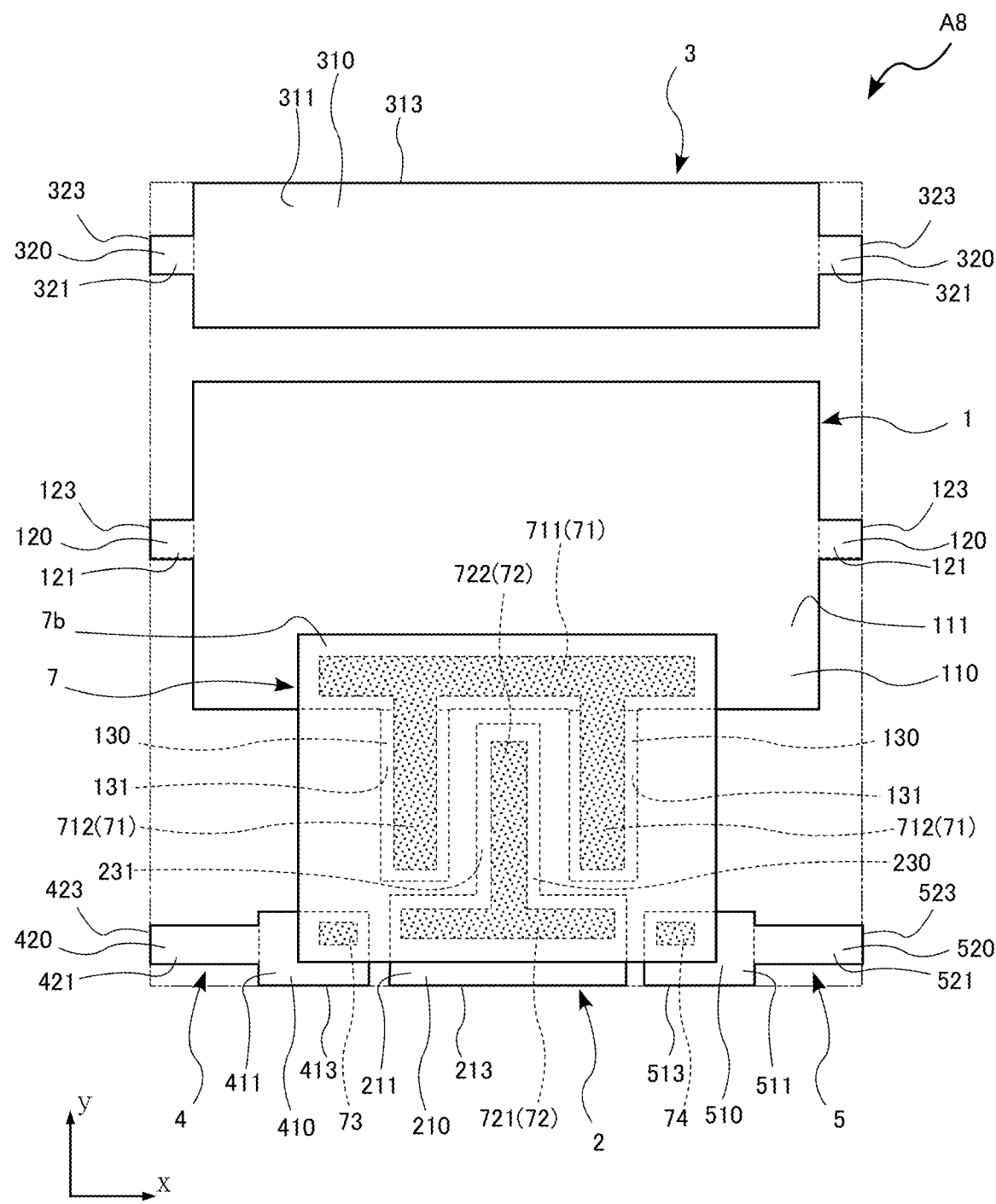
FIG. 18 is a plan view showing a semiconductor device according to an eighth embodiment.

Referring to FIG. 18, a semiconductor device A8 according to an eighth embodiment of the present disclosure will be described hereunder. In FIG. 18, the elements same as or similar to those of the semiconductor device A1 are given the same numeral, and the description of such elements will not be repeated.

FIG. 18 is a plan view of the semiconductor device A8, corresponding to FIG. 2 showing the first embodiment. For the sake of clarity, FIG. 18 illustrates a view seen through the sealing resin 8 and the connection lead 6, indicating the outline of the sealing resin 8 by imaginary lines (dash-dot-dot lines).

The semiconductor device A8 according to this embodiment is different from the semiconductor device A1, in the shape of the drain electrode 71 and the source electrode 72 of the semiconductor element 7, the first lead 1, and the second lead 2.

In the eighth embodiment, the first lead 1 includes two extended sections 130, and the second lead 2 includes one extended section 230. The drain electrode 71 includes two extended sections 712, and the source electrode 72 includes one extended section 722.

This embodiment also provides the advantages similar to those provided by the first embodiment. Here, the number of pieces of the extended section 130 of the first lead 1, and the number of pieces of the extended section 230 of the second lead 2 are not specifically limited. For example, a single extended section 130 and two extended sections 230 may be provided. The shape of the drain electrode 71 (the number of pieces of the extended section 712 inclusive), and the shape of the source electrode 72 (the number of pieces of the extended section 722 inclusive) are each designed in accordance with the number of pieces and the location of the extended section 130 of the first lead 1, and the extended section 230 of the second lead 2.

Figure 19:
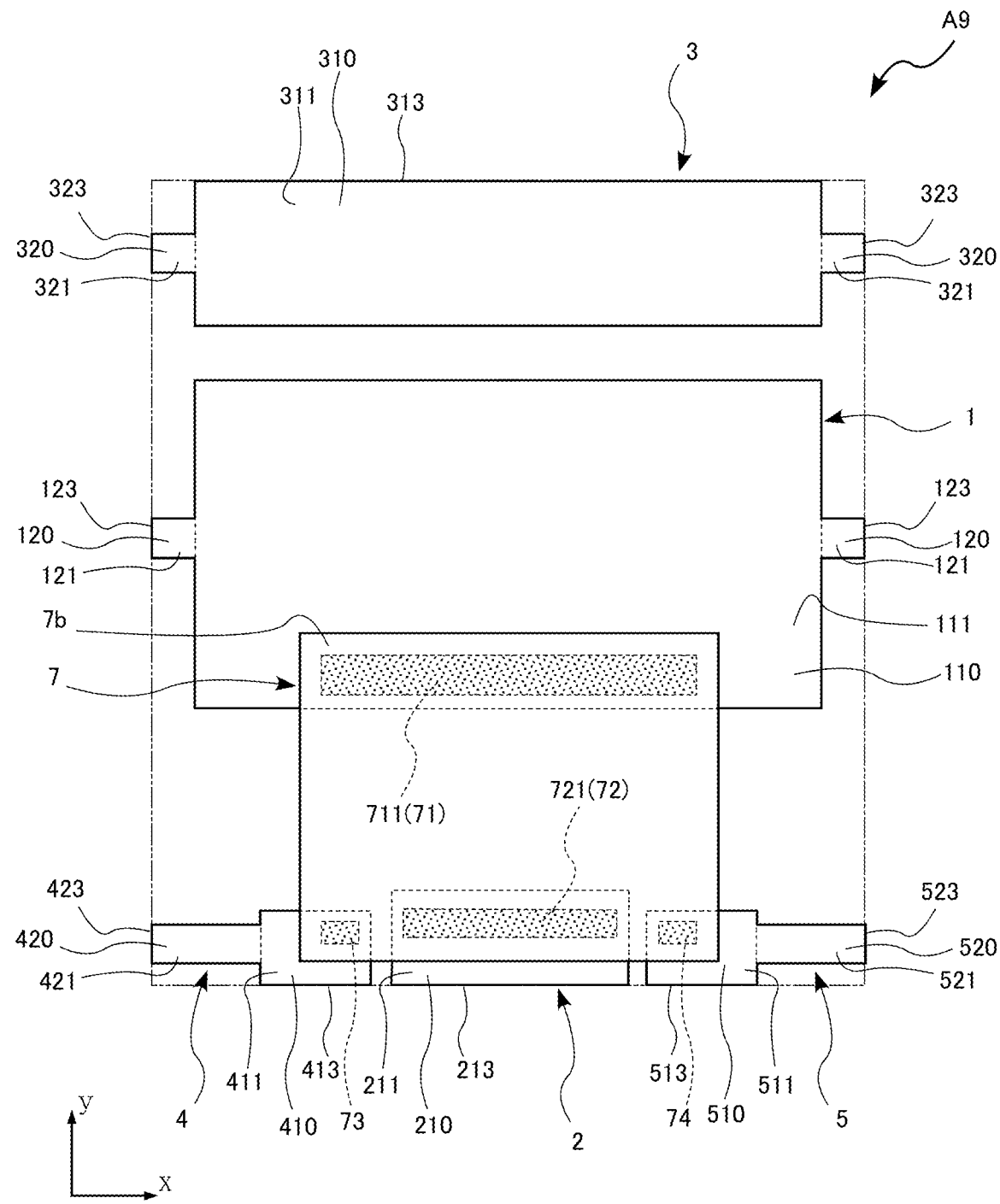
FIG. 19 is a plan view showing a semiconductor device according to a ninth embodiment.

Referring to FIG. 19, a semiconductor device A9 according to a ninth embodiment of the present disclosure will be described hereunder. In FIG. 19, the elements same as or similar to those of the semiconductor device A1 are given the same numeral, and the description of such elements will not be repeated.

FIG. 19 is a plan view of the semiconductor device A9, corresponding to FIG. 2 showing the first embodiment. For the sake of clarity, FIG. 19 illustrates a view seen through the sealing resin 8 and the connection lead 6, indicating the outline of the sealing resin 8 by imaginary lines (dash-dot-dot lines).

The semiconductor device A9 according to this embodiment is different from the semiconductor device A1, in the shape of the drain electrode 71 and the source electrode 72 of the semiconductor element 7, the first lead 1, and the second lead 2.

In the ninth embodiment, the first lead 1 has no extended section 130, and the second lead 2 has no extended section 230. In addition, the drain electrode 71 has no extended section 712, and the source electrode 72 has no extended section 722. Thus, the semiconductor element 7 is supported solely by a part of the terminal section 110 of the first lead 1, a part of the supporting section 210 of the second lead 2, a part of the terminal section 410 of the fourth lead 4, and a part of the terminal section 510 of the fifth lead 5. In addition, the drain electrode 71 is bonded to the terminal section obverse face 111 of the first lead 1, solely via the belt-like section 711, and the source electrode 72 is bonded to the supporting section obverse face 211 of the second lead 2, solely via the belt-like section 721.

In this embodiment also, since the semiconductor element 7 is flip-chip bonded, the inductance can be reduced. In addition, the principal current flows through the connection lead 6, in the direction opposite to the flow direction in the current path from the first lead 1 to the second lead 2. Accordingly, the magnetic fields cancel each other, so that the generation of the inductance can be suppressed. The connection lead 6 serves as a heat dissipating plate that releases the heat generated by the semiconductor element 7. As result, an increase in temperature of the semiconductor element 7 can be suppressed. Further, the connection lead 6 serves as the shielding plate against the noise generated by the semiconductor element 7, and therefore noise emission from the semiconductor device A1 can be suppressed.

Figure 20:
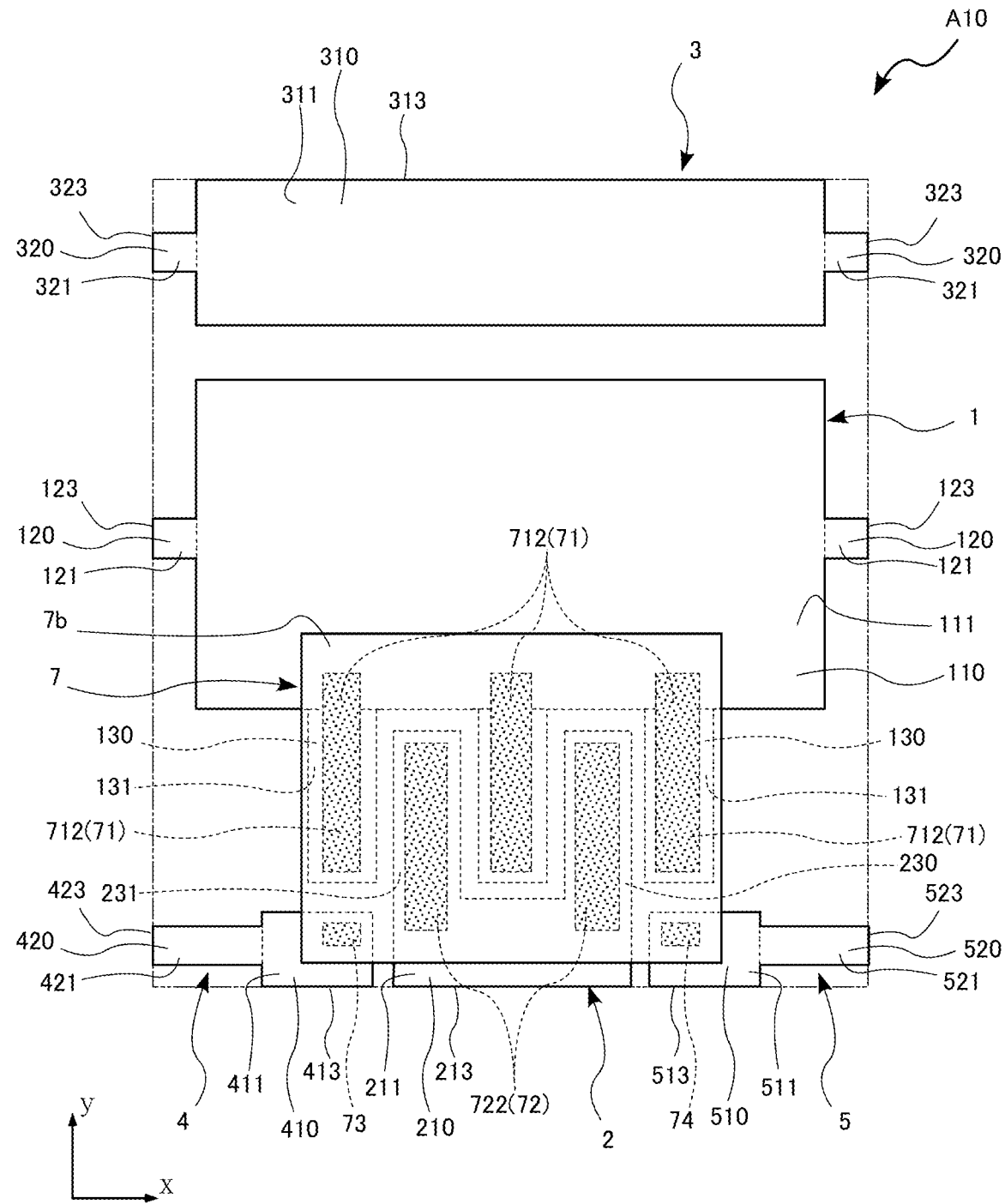
FIG. 20 is a plan view showing a semiconductor device according to a tenth embodiment.

Referring to FIG. 20, a semiconductor device A10 according to a tenth embodiment of the present disclosure will be described hereunder. In FIG. 20, the elements same as or similar to those of the semiconductor device A1 are given the same numeral, and the description of such elements will not be repeated.

FIG. 20 is a plan view of the semiconductor device A10, corresponding to FIG. 2 showing the first embodiment. For the sake of clarity, FIG. 20 illustrates a view seen through the sealing resin 8 and the connection lead 6, indicating the outline of the sealing resin 8 by imaginary lines (dash-dot-dot lines).

The semiconductor device A10 according to this embodiment is different from the semiconductor device A1, in the shape of the drain electrode 71 and the source electrode 72 of the semiconductor element 7.

In the tenth embodiment, the drain electrode 71 has no belt-like section 711, and the source electrode 72 has no belt-like section 721. Accordingly, the drain electrode 71 is bonded to the extended section obverse face 131 and the terminal section obverse face 111 of the first lead 1, solely via the extended section 712, and the source electrode 72 is bonded to the extended section obverse face 231 and the supporting section obverse face 211 of the second lead 2, solely via the extended section 722.

This embodiment also provides the advantages similar to those provided by the first embodiment.

Figure 21:
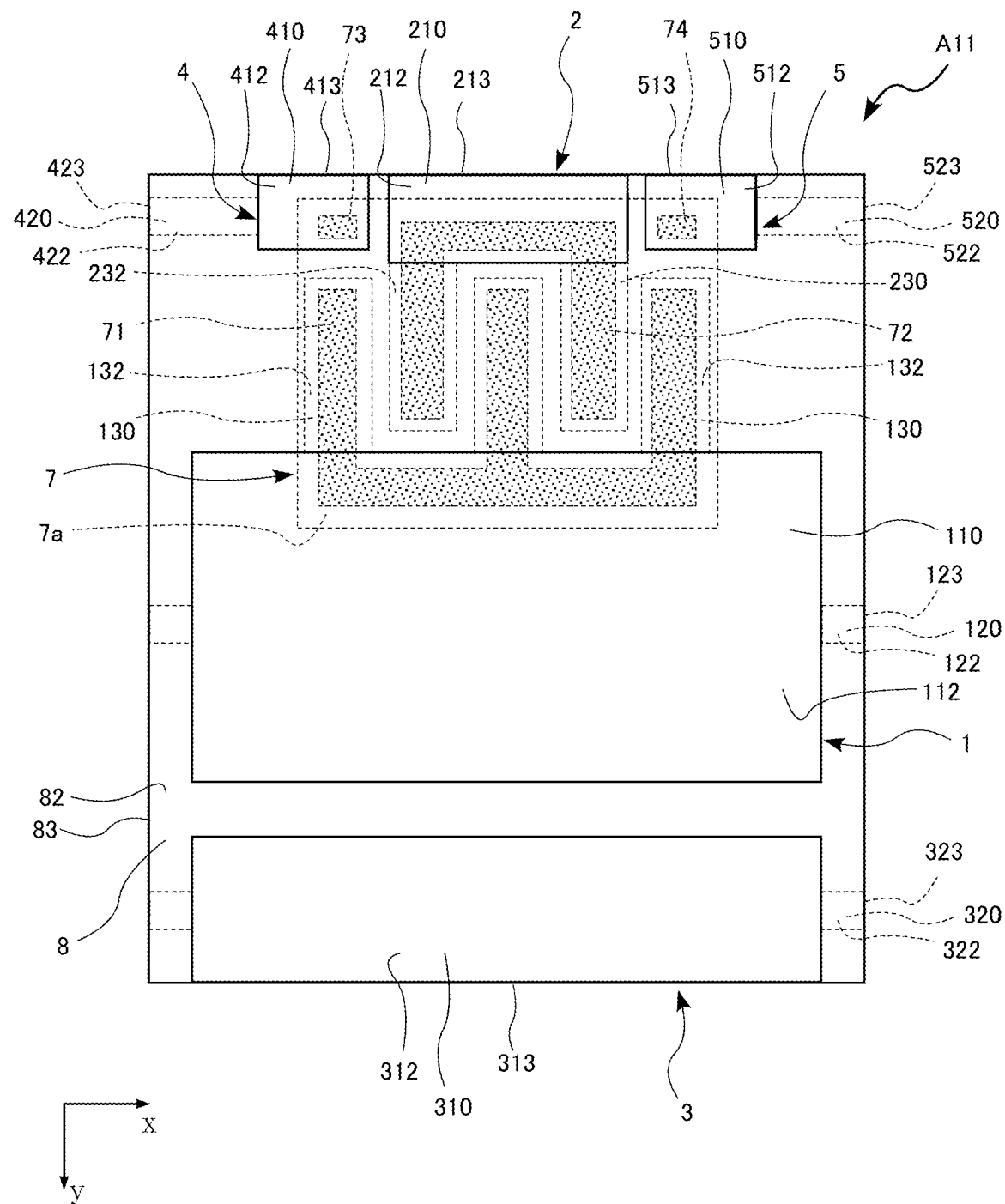
FIG. 21 is a bottom view showing a semiconductor device according to an eleventh embodiment.

Referring to FIG. 21, a semiconductor device A11 according to an eleventh embodiment of the present disclosure will be described hereunder. In FIG. 21, the elements same as or similar to those of the semiconductor device A1 are given the same numeral, and the description of such elements will not be repeated.

FIG. 21 is a bottom view of the semiconductor device A11, corresponding to FIG. 5 showing the first embodiment.

The semiconductor device A11 according to this embodiment is different from the semiconductor device A1, in that the supporting section reverse face 212 of the second lead 2 is exposed from the resin reverse face 82 of the sealing resin 8, and that the supporting section reverse face 212 and the resin reverse face 82 are flush with each other. It should be noted that, when the semiconductor device A11 is surface-mounted on a circuit board, the second lead 2 is not connected as the source terminal, to the wiring of the circuit board.

This embodiment also provides the advantages similar to those provided by the first embodiment.

Figure 22:
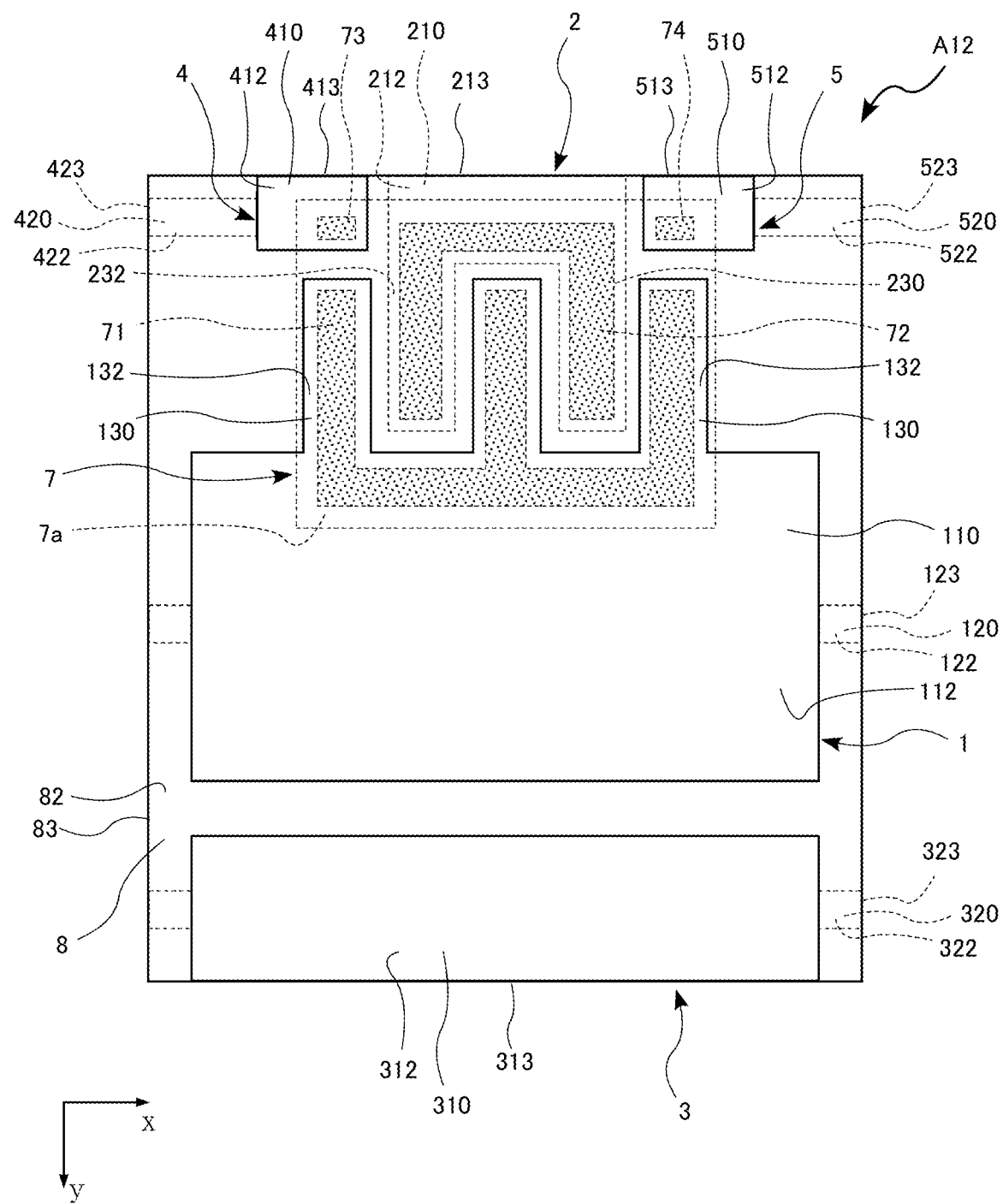
FIG. 22 is a bottom view showing a semiconductor device according to a twelfth embodiment.

Referring to FIG. 22, a semiconductor device A12 according to a twelfth embodiment of the present disclosure will be described hereunder. In FIG. 22, the elements same as or similar to those of the semiconductor device A1 are given the same numeral, and the description of such elements will not be repeated.

FIG. 22 is a bottom view of the semiconductor device A12, corresponding to FIG. 5 showing the first embodiment.

The semiconductor device A12 according to this embodiment is different from the semiconductor device A1, in that the extended section reverse face 132 of the first lead 1 is exposed from the resin reverse face 82 of the sealing resin 8, and that the extended section reverse face 132 and the resin reverse face 82 are flush with each other. The extended section reverse face 232 of the second lead 2 is not exposed from the resin reverse face 82, and therefore the extended section 130 and the extended section 230 can be prevented from being connected via a solder paste, when the semiconductor device A12 is surface-mounted on a circuit board. Consequently, a short circuit between the first lead 1 and the second lead 2 can be prevented.

This embodiment also provides the advantages similar to those provided by the first embodiment. According to this embodiment, further, since the extended section reverse face 132 is exposed from the resin reverse face 82, heat can be dissipated through the extended section reverse face 132, when the semiconductor device A12 is surface-mounted on a circuit board. Therefore, the heat dissipation performance can be further improved. Here, although this embodiment represents the case where the extended section reverse face 132 of the first lead 1 is exposed from the resin reverse face 82, but the extended section reverse face 232 of the second lead 2 is not exposed from the resin reverse face 82, the same advantages can also be attained, when the extended section reverse face 232 of the second lead 2 is exposed from the resin reverse face 82, and the extended section reverse face 132 of the first lead 1 is not exposed from the resin reverse face 82.

The semiconductor device according to the present disclosure is not limited to the foregoing embodiments. The specific configurations of the elements of the semiconductor device according to the present disclosure may be designed in various different manners.

[Clause 1]

A semiconductor device comprising:

a semiconductor element including an electron transit layer formed of a nitride semiconductor, an element obverse face and an element reverse face arranged to face opposite to each other in a thickness direction, and a gate electrode, a source electrode and a drain electrode that are disposed on the element obverse face;

a first lead to which the drain electrode is bonded;

a second lead to which the source electrode is bonded; and a connection lead connected to the second lead and disposed on the element reverse face so as to overlap with the semiconductor element as viewed in the thickness direction, in which the connection lead provides a conduction path for a principal current subjected to switching.

[Clause 2]

The semiconductor device according to Clause 1, in which the connection lead is in contact with the element reverse face.

[Clause 3]

The semiconductor device according to Clause 2, in which the semiconductor element further includes a reverse face electrode disposed on the element reverse face and electrically connected to the source electrode, and the reverse face electrode is bonded to the connection lead.

[Clause 4]

The semiconductor device according to any one of Clauses 1 to 3, further including a sealing resin covering the semiconductor element, in which a part of the connection lead is exposed from the sealing resin.

[Clause 5]

The semiconductor device according to Clause 4, in which the sealing resin includes: a resin obverse face and a resin reverse face arranged to face opposite to each other in the thickness direction; and a resin side face connected to the resin obverse face and the resin reverse face.

[Clause 6]

The semiconductor device according to Clause 5, in which the second lead is not exposed from the resin obverse face and the resin reverse face.

[Clause 7]

The semiconductor device according to Clause 5 or 6, in which the connection lead includes a metal plate.

[Clause 8]

The semiconductor device according to Clause 7, in which the connection lead includes:
- a first plate-shaped section overlapping with the semiconductor element as viewed in the thickness direction; and
- a second plate-shaped section connected to the second lead and the first plate-shaped section.

[Clause 9]

The semiconductor device according to Clause 8, further including a third lead disposed opposite to the second lead with respect to the first lead,
in which the connection lead further includes a third plate-shaped section connected to the third lead and the first plate-shaped section.

[Clause 10]

The semiconductor device according to Clause 9, in which the second plate-shaped section and the third plate-shaped section are parallel to the thickness direction.

[Clause 11]

The semiconductor device according to Clause 9 or 10, in which a part of each of the first lead and the third lead is exposed from the resin reverse face.

[Clause 12]

The semiconductor device according to any one of Clauses 9 to 11, in which the third lead includes a third end face oriented opposite to the first lead and exposed from the resin side face, and
the third end face and the resin side face are flush with each other.

[Clause 13]

The semiconductor device according to any one of Clauses 5 to 12, further including a fourth lead disposed on a same side as the second lead with respect to the first lead, and the gate electrode is bonded to the fourth lead.

[Clause 14]

The semiconductor device according to Clause 13, in which the fourth lead includes a fourth end face oriented opposite to the first lead and exposed from the resin side face, and
the fourth end face and the resin side face are flush with each other.

[Clause 15]

The semiconductor device according to any one of Clauses 4 to 14, in which the first lead includes a plurality of first extended sections extending toward the second lead, as viewed in the thickness direction,
the second lead includes a second extended section extending toward the first lead and disposed between the plurality of first extended sections, as viewed in the thickness direction, and
the semiconductor element is supported by the first extended sections and the second extended section.

[Clause 16]

The semiconductor device according to any one of Clauses 4 to 14, in which the second lead includes a plurality of second extended sections extending toward the second lead, as viewed in the thickness direction,
the first lead includes a first extended section extending toward the second lead and disposed between the plurality of second extended sections, as viewed in the thickness direction, and
the semiconductor element is supported by the first extended section and the second extended sections.

[Clause 17]

The semiconductor device according to Clause 15 or 16, in which the first lead includes two or more of the first extended sections,
the second lead includes two or more of the second extended sections, and
the first extended sections and the second extended sections are alternately arranged in a direction orthogonal to a direction in which the first extended sections extend and to the thickness direction.

[Clause 18]

The semiconductor device according to any one of Clauses 15 to 17, in which the first extended sections and the second extended sections are covered with the sealing resin.

REFERENCE SIGNS

A1 to A12: semiconductor device
1: first lead
110: terminal section
111: terminal section obverse face
112: terminal section reverse face
120: connecting section
121: connecting section obverse face
122: connecting section reverse face
123: connecting section end face
130: extended section
131: extended section obverse face
132: extended section reverse face
2: second lead
210: supporting section
211: supporting section obverse face
212: supporting section reverse face
213: supporting section end face
230: extended section
231: extended section obverse face
232: extended section reverse face
3: third lead
310: terminal section
311: terminal section obverse face
312: terminal section reverse face
313: terminal section end face
314: protruding section
320: connecting section
321: connecting section obverse face
322: connecting section reverse face
323: connecting section end face
4: fourth lead
410: terminal section
411: terminal section obverse face
412: terminal section reverse face
413: terminal section end face
420: connecting section
421: connecting section obverse face 422: connecting section reverse face
423: connecting section end face
5: fifth lead
510: terminal section
511: terminal section obverse face
512: terminal section reverse face
513: terminal section end face
520: connecting section
521: connecting section obverse face
522: connecting section reverse face
523: connecting section end face
6: connection lead
61: first plate-shaped section
61a: first plate-shaped section obverse face
61b: first plate-shaped section reverse face
61c: elevated face
62: second plate-shaped section
63: third plate-shaped section
65: columnar section
7: semiconductor element
71: drain electrode
711: belt-like section
712: extended section
72: source electrode
721: belt-like section
722: extended section
73, 74: gate electrode
75: reverse face electrode
70: element main body
7a: element obverse face
7b: element reverse face
701: substrate
702: buffer layer
703: first nitride semiconductor layer
704: second nitride semiconductor layer
705: third nitride semiconductor layer
706: protective film
707: conductive section
709, 709a to 709c: wiring
8: sealing resin
81: resin obverse face
82: resin reverse face
83: resin side face

The invention claimed is:

1. A semiconductor device comprising:
a semiconductor element including an electron transit layer formed of a nitride semiconductor, an element obverse face and an element reverse face arranged to face opposite to each other in a thickness direction, and a gate electrode, a source electrode and a drain electrode disposed on the element obverse face;
a first lead to which the drain electrode is bonded;
a second lead to which the source electrode is bonded; and
a connection lead connected to the second lead and disposed on the element reverse face so as to overlap with the semiconductor element as viewed in the thickness direction,
wherein the connection lead provides a conduction path for a principal current subjected to switching.

2. The semiconductor device according to claim 1, wherein the connection lead is disposed in contact with the element reverse face.

3. The semiconductor device according to claim 2, wherein the semiconductor element further includes a reverse face electrode disposed on the element reverse face and electrically connected to the source electrode, and the reverse face electrode is bonded to the connection lead.

4. The semiconductor device according to claim 1, further comprising a sealing resin covering the semiconductor element,
wherein a part of the connection lead is exposed from the sealing resin.

5. The semiconductor device according to claim 4, wherein the sealing resin includes: a resin obverse face and a resin reverse face arranged to face opposite to each other in the thickness direction; and a resin side face connected to the resin obverse face and the resin reverse face.

6. The semiconductor device according to claim 5, wherein the second lead is not exposed from the resin obverse face and the resin reverse face.

7. The semiconductor device according to claim 5, wherein the connection lead includes a metal plate.

8. The semiconductor device according to claim 7, wherein the connection lead includes:
a first plate-shaped section overlapping with the semiconductor element as viewed in the thickness direction; and
a second plate-shaped section connected to the second lead and the first plate-shaped section.

9. The semiconductor device according to claim 8, further comprising a third lead disposed opposite to the second lead with respect to the first lead,
wherein the connection lead further includes a third plate-shaped section connected to the third lead and the first plate-shaped section.

10. The semiconductor device according to claim 9, wherein the second plate-shaped section and the third plate-shaped section are parallel to the thickness direction.

11. The semiconductor device according to claim 9, wherein a part of each of the first lead and the third lead is exposed from the resin reverse face.

12. The semiconductor device according to claim 9, wherein the third lead includes a third end face oriented opposite to the first lead and exposed from the resin side face, and
the third end face and the resin side face are flush with each other.

13. The semiconductor device according to claim 5, further comprising a fourth lead disposed on a same side as the second lead with respect to the first lead, wherein the gate electrode is bonded to the fourth lead.

14. The semiconductor device according to claim 13, wherein the fourth lead includes a fourth end face oriented opposite to the first lead and exposed from the resin side face, and
the fourth end face and the resin side face are flush with each other.

15. The semiconductor device according to claim 4, wherein the first lead includes a plurality of first extended sections extending toward the second lead as viewed in the thickness direction,
the second lead includes a second extended section extending toward the first lead and disposed between the plurality of first extended sections as viewed in the thickness direction, and
the semiconductor element is supported by the first extended sections and the second extended section.

16. The semiconductor device according to claim 4, wherein the second lead includes a plurality of second extended sections extending toward the second lead as viewed in the thickness direction, the first lead includes a first extended section extending toward the second lead and disposed between the plurality of second extended sections, as viewed in the thickness direction, and the semiconductor element is supported by the first extended section and the second extended sections.

17. The semiconductor device according to claim 15, wherein the first lead includes two or more of the first extended sections, the second lead includes two or more of the second extended sections, and the first extended sections and the second extended sections are alternately arranged in a direction orthogonal to a direction in which the first extended sections extend and to the thickness direction.

18. The semiconductor device according to claim 15, wherein the first extended sections and the second extended sections are covered with the sealing resin.

\* \* \* \* \*